US005976920A

United States Patent [19]

Nakano et al.

[11] Patent Number: 5,976,920
[45] Date of Patent: Nov. 2, 1999

[54] SINGLE LAYER INTEGRATED METAL PROCESS FOR HIGH ELECTRON MOBILITY TRANSISTOR (HEMT) AND PSEUDOMORPHIC HIGH ELECTRON MOBILITY TRANSISTOR (PHEMT)

[75] Inventors: Kenichi Nakano, Beavercreek; Christopher A. Bozada, Dayton; Tony K. Quach, Kettering; Gregory C. DeSalvo, Beavercreek; G. David Via; Ross W. Dettmer, both of Dayton; Charles K. Havasy; James S. Sewell, both of Kettering; John L. Ebel, Beavercreek; James K. Gillespie, Cedarville, all of Ohio

[73] Assignee: The United States of America as represented by the Secretary of the Air Force, Washington, D.C.

[21] Appl. No.: 08/684,761

[22] Filed: Jul. 22, 1996

[51] Int. Cl.[6] .................................................. H01L 21/338
[52] U.S. Cl. .......................... 438/172; 438/949; 438/423
[58] Field of Search .............................. 437/40–41, 912; 257/194; 438/172, 949, 423

[56] References Cited

U.S. PATENT DOCUMENTS

| | | | |
|---|---|---|---|
| 3,764,865 | 10/1973 | Napoli et al. | 317/235 |
| 3,855,690 | 12/1974 | Kim et al. | 29/571 |
| 3,861,024 | 1/1975 | Napoli et al. | 29/579 |
| 3,943,622 | 3/1976 | Kim et al. | 29/579 |
| 4,961,194 | 10/1990 | Kuroda et al. | 357/22 |
| 5,352,909 | 10/1994 | Hori . | |

FOREIGN PATENT DOCUMENTS 7-312373  11/1995  Japan .

OTHER PUBLICATIONS

*Etch Rates and Selectivities of Citric Acid/Hydrogen Peroxide on GaAs, $Al_{0.3}Ga_{0.7}As$, $In_{0.2}Ga_{0.8}As$, $In_{0.53}Ga_{0.47}As$, $In_{0.52}Al_{0.48}As$, and InP*, authored by G.C. DeSalvo et al., p. 831 in the J. Electrochem. Soc., vol. 9, No. 3, Mar. 1992.

*Citric Acid Etching of $GaAs_{1-x}Sb_x$, $Al_{0.5}Ga_{0.5}Sb$, and InAs for Heterostructure Device Fabrication*, authored by G.C. DeSalvo et al., p. 3526 in the J. Electrochem. Soc., vol. 141, No. 12, Dec. 1994.

*High–Performance Self–Aligned p+/n GaAs Epitaxial JFET's Incorporating AlGaAs Etch–Stop Layer*, authored by J.K. Abrokwah et al., p. 1529 in the IEEE Transactions on ELectron Devices, vol. 37, No. 6, Jun. 1990.

*Making a High–Yield, 0.33 Micron, MBE–Based GaAs MMIC Production Process*, authored by R.D. Remba et al., p. 90 in the proceedings of the 1994 U.S. Conference on GaAs Manufacturing Technology (MANTECH), May 1994.

*Simplified Ohmic and Schottky Contact Formation for Field Effect Transistors Using the Single Layer Integrated Metal Field Effect Transistor (SLIMFET) Process*, authored by G.C. DeSalvo et al., p. 314 in the IEEE Transactions on Semiconductor Manufacturing, vol. 8, No. 3, Aug., 1995.

(List continued on next page.)

Primary Examiner—Richard Booth
Attorney, Agent, or Firm—Gerald B. Hollins; Thomas L. Kundert

[57] ABSTRACT

A method for fabricating a periodic table group III–IV HEMT/pHEMT field-effect transistor device. The disclosed fabrication arrangement uses a single metalization for ohmic and Schottky barrier contacts, employs selective etching with a permanent etch stop layer, employs a non-alloyed ohmic contact semiconductor layer and includes a permanent non-photosensitive secondary mask element. The invention includes provisions for both an all optical lithographic process and a combined optical and electron beam lithographic process These concepts are combined to provide a field-effect transistor device of reduced fabrication cost, increased dimensional accuracy and state of the art electrical performance.

23 Claims, 8 Drawing Sheets

OTHER PUBLICATIONS

*All–Refractory GaAs FET Using Amorphous TiWSi$_x$ Source/ Drain Metallization and Graded–In$_x$Ga$_{1-x}$As Layers*, authored by N.A. Papanicolaou et al., p. 7 in the IEEE Electron Device Letters, vol. 15, No. 1, Jan. 1994.

*A New Fabrication Technology for AlGaAs/GaAs HEMT LSI's Using InGaAs Nonalloyed Ohmic Contacts*, authored by S. Kuroda et al., p. 2196 in the IEEE Transactions on Electron Devices, vol. 36, No. 10, Oct. 1989.

*A Highly Manufacturable 0.2 μm AlGaAs/InGaAs PHEMT Fabricated Using the Single–Layer Integrated–Metal FET (SLIMFET) Process*, authored by Charles K. Havasy et al., appearing in the IEEE Gallium Arsenide Integrated Circuit Symposium, Conference Proceedings, San Diego, CA, Oct. 1995.

*Ohmic Contacts to n–GaAs Using Graded Band Gap Layers of Ga$_{1-x}$In$_x$As Grown by Molecular Beam Epitaxy*, authored by J.M. Woodall et al., p. 626 in the J. Vac. Sci. Technol. vol. 19, No. 3, Sep./Oct. 1981.

*HEMT with Nonalloyed Ohmic Contacts Using n+ –InGaAs Cap Layer*, authored by S. Kuroda et al., p. 389 in the IEEE Electron Device Letters, vol. EDL–8, No. 9, Sep. 1987.

*Extremely Low Nonalloyed and Alloyed Contact Resistance Using an InAs Cap Layer on InGaAs by Molecular–Beam Epitaxy*, authored by C.K. Peng et al., p. 429 in the J. Appl. Phys. vol. 64, No. 1, Jul. 1, 1988.

*Non–Alloyed Ohmic Contacts to n–GaAs Using Compositionally Graded In$_x$Ga$_{1-x}$As Layers*, authored by T. Nittono et al., pp. 1718–1722 in the Japanese Journal of Applied Physics, vol. 27, No. 9, Sep. 1988.

*Extremely Low Contact Resistances for AlGaAs/GaAs Modulation–Doped Field–Effect Transistor Structures*, authored by A. Ketterson et al., p. 2305 in the J. Appl. Phys. vol. 57, No. 6, Mar. 1985.

*Single–Cycle Lithography Process for Both Large and Sub–Half Micron Features*, authored by J.S. Sewell et al., p. 177 in the SPIE, vol. 1671, 1992.

*A Combined Electron Beam/Optical Lithography Process Step for the Fabrication of Sub–Half–Micron–Gate–Length MMIC Chips*, authored by J.S. Sewell et al., and appearing in the Conference Proceedings of the Fourth National Technology Transfer Conference and Exposition, Dec. 7–9, 1993, Anaheim, California, NASA Conference Publication 3249, vol. 1, p. 54.

SINGLE LAYER INTEGRATED METAL PROCESS FOR HIGH ELECTRON MOBILITY TRANSISTOR (HEMT) AND PSEUDOMORPHIC HIGH ELECTRON MOBILITY TRANSISTOR (PHEMT)

RIGHTS OF THE GOVERNMENT

The invention described herein may be manufactured and used by or for the Government of the United States for all governmental purposes without the payment of any royalty.

CROSS REFERENCE TO RELATED PATENT DOCUMENTS

The present document is somewhat related to the copending and commonly assigned patent application documents "Metal Semiconductor Field-Effect Transistor (MESFET) Device With Single Layer Metal", AFD 00156, Ser. No. 08/684,759, now U.S. Pat. No. 5,796,131. "Single Layer Integrated Metal Process for Metal Semiconductor Field-Effect Transistor (MESFET)", AFD 00157, Ser. No. 08/684,760; "High Electron Mobility Transistor (HEMT) and Pseudomorphic High Electron Mobility Transistor (pHEMT) Devices With Single Layer Integrated Metal", AFD 00158, Ser. No. 08/684,756, now U.S. Pat. No. 5,698,870; "Field-Effect Transistor Process With Semiconductor Mask, Single Layer Integrated Metal, and Dual Etch Stops", AFD 00169, Ser. No. 08/684,755; and "Field-Effect Transistor Device With Single Layer Integrated Metal and Retained Semiconductor Masking", AFD 00170, Ser. No. 08/684,734, now U.S. Pat. No. 5,698,900, which are all filed of even date herewith. The contents of these related applications are hereby incorporated by reference herein.

BACKGROUND OF THE INVENTION

This invention relates to field-effect transistor fabrication.

The present invention achieves the goal of a field-effect transistor in which a single metalization step realizes the gate contact and the source/drain contacts—a single metalization arrangement which is practical, economically viable and does not require separate masking steps for the Schottky barrier and ohmic junction characteristics of the gate contact and the source/drain contacts respectively. The invention arises from compromise between several semiconductor device disciplines—including material growth, device metalization, and material deposition. The achieved field-effect transistor is technically and economically viable for use in analog transistor applications extending to the microwave and millimeter wave spectral regions for example.

Several concepts appearing in the present invention also appear in the patent and publication literature as stand-alone concepts, concepts used in a different setting or concepts combined in less than the combination contemplated in the present invention. The present invention is however, believed to represent a novel and unobvious combination of such concepts to achieve a useful result. The concept of using the same metal in parts of the source, drain and gate structure of a field-effect transistor for example appears in a certain form in transistors fabricated some years ago when the self aligned gate structure was new in the art. Examples of this same metal concept appear for example in the two related RCA patents of Napoli et al., U.S. Pat. No. 3,764,865 and U.S. Pat. No. 3,861,024. The same metal concept also appears in the two related Westinghouse patents of Kim, U.S. Pat. No. 3,855,690 and U.S. Pat. No. 3,943,622.

In each of these four patents however, the disclosed transistor involves use of a common metal to connect to an already formed source/drain ohmic contact and to form the Schottky barrier gate contact. In the silicon material used in the devices of these four patents an ohmic contact is moreover achieved with the mere addition of another layer of material and does not require the alloying, annealing and other complexities needed for a group III–V semiconductor device ohmic contact. The present invention is believed distinguished over the disclosure of these older patents by its use the same metal to actually form the gate contact as to form the source/drain contacts of the transistor. Moreover in the present invention these source/drain contacts are achieved in a non alloy fashion.

The U.S. Pat. No. 4,961,194 of S. Kuroda et al., describes gallium arsenide MESFET and HEMT devices which use the combination of non-alloyed ohmic contacts, same metal electrodes, acetone solvent removal of photoresist coatings, ion implanted device separation areas, selective etching and etch stopping at the surface of a device layer. Although each of these concepts may be used in the present invention additional concepts not disclosed in the Kuroda et al. patent are also a part of the present invention and provide significant distinction over the Kuroda et al. Patent. The Kuroda et al. patent for example does not disclose the use of a permanent secondary mask and passivation material layer nor the concept of a gate aperture recess received in a gate window nor the precise and time effective termination of etching operations as is accomplished in applicants' invention. In view of the similar areas of work and in the interest of minimizing the size of the present patent document, the contents of the of S. Kuroda et al. U.S. Pat. No. 4,961,194 patent are hereby incorporated by reference herein.

An article published in the technical literature some years ago is also of interest with respect to the single metal concept and is additional of interest with respect to the use of non-alloyed ohmic contacts in a field-effect transistor. This article "A New Fabrication Technology for AlGaAs/ GaAs HEMT LSI's Using InGaAs Non-alloyed Ohmic Contacts" is authored by S. Kuroda et al., apparently the same S. Kuroda et al., as appears in the above identified U.S. Pat. No. 4,961,194 United States patent, and appears at page 2196 in the Institute of Electrical and Electronic Engineers Transactions on Electron Devices, Volume 36, number 10, October, 1989. This Kuroda article is in fact of an especially enlightening contrast in nature with respect to the present invention since it teaches the use of a complex etching sequence during formation of certain elements and the present invention avoids use of this sequence in favor of a more practical and less costly procedure.

In a somewhat related situation the technical article "All-Refractory GaAs FET Using Amorphous $TiWSi_x$ Source/Drain Metalization and Graded $In_xGa_{1-x}As$ Layers" authored by N. Papanicolaou which appears at page 7 in the Institute of Electrical and Electronic Engineers Electron Devices Letters, volume 15, number 1, January, 1994 discloses the use of non-alloyed ohmic contacts in a gallium arsenide field-effect transistor. The Papanicolaou article however, relates to the fabrication of a high temperature field-effect transistor device, a device having refractory metal elements and involving the use of Tungsten metal. The Papanicolaou article also presents an informative discussion of the non-alloyed ohmic contact art.

The inventors of the present invention have also found the textbook "Modern GaAs Processing Methods" authored by Ralph Williams, Artech House, of Boston and London, to be of assistance in explaining and understanding certain aspects attending the present invention including its relationship with the prior art. In the further interest of minimizing the size of the present patent document, the contents of the Ralph Williams, Artech House textbook are therefore hereby incorporated by reference herein.

Non-alloyed ohmic contacts are additionally disclosed in several published technical journal articles as follows.

1. Ohmic Contacts to n-GaAs Using Graded Band Gap Layers of $Ga_{1-x}In_xAs$ Grown by Molecular Beam Epitaxy, authored by J. M. Woodall et al., and appears at page 626 in the J. Vacuum. Science. Technology. Vol 19, number 3, September/October 1981.

2. HEMT with Non-alloyed Ohmic Contacts Using $n^+$-InGaAs Cap Layer, authored by S. Kuroda et al., and appears at page 389 in the IEEE Electron Device Letters, Volume EDL-8, number 9, September 1987.

3. Extremely Low Non-alloyed and Alloyed Contact Resistance Using an InAs Cap Layer on InGaAs by Molecular-Beam Epitaxy, authored by C. K. Peng et al., and appears at page 429 in the J. Applied. Physics. Volume 64, number 1, Jul. 1, 1988.

4. Non-Alloyed Ohmic Contacts to n-GaAs Using Compositional Graded $In_xGa_{1-x}As$ Layers, authored by T. Nittono et al., and appears at pages 1718–1722 in the Japanese Journal of Applied Physics, Volume 27, number 9, September 1988.

5. Extremely Low Contact Resistances for AlGaAs/GaAs Modulation-Doped Field-Effect Transistor Structures, authored by A. Ketterson et al., and appears at page 2305 in the J. Applied. Physics. Volume 57, number 6.

Although each of these documents from the prior art may relate to an aspect of the present invention it is believed that the invention as described herein represents the first combination of the plurality of concepts and compromises necessary to achieve a successful single metal, non-alloyed contact, selective etching-achieved, and secondary mask-inclusive field-effect transistor.

SUMMARY OF THE INVENTION

The present invention provides for the combination of transistor fabrication concepts known in different settings into a field-effect transistor of simplified structure and low cost manufacturing process. The invention adds a structural element, a masking/electrically insulating/passivating layer, and related processing steps which are useful in both the fabrication sequence and as an element of the completed transistor. The invention process relates to several different transistor types.

It is an object of the present invention therefore to provide an improved lower cost method for fabricating a HEMT/pHEMT field-effect transistor.

It is another object of the invention to simplify the fabrication processing of a field-effect transistor.

It is another object of the invention to provide a field-effect transistor in which a mask layer used during fabrication etching steps is beneficially allowed to remain in the completed device.

It is another object of the present invention to provide a periodic table group III–V field-effect transistor process in which a dielectric material mask layer used during fabrication etching steps is employed as a completed device passivation layer.

It is another object of the invention to provide a gallium arsenide field-effect transistor process in which an etch stop function is provided by either a thin layer of material specifically added for this purpose or by inherent differences in the etch rate of employed semiconductor materials.

It is another object of the invention to provide a gallium arsenide field-effect transistor process in which an etch stop function is provided by inherent differences in the etch rate of employed semiconductor materials.

It is an object of the invention to simplify or eliminate steps from the metal fabrication processing of a field-effect transistor.

It is another object of the present invention to provide a field-effect transistor fabrication process in which certain lithographic and metal deposition steps for forming a Schottky gate contact element also form the transistor drain/source ohmic contact elements.

It is another object of the invention to provide a field-effect transistor fabrication process in which a gallium arsenide device is improved through the use of indium gallium arsenide cap layer-enabled non-alloyed ohmic contacts of low electrical contact resistance.

It is another object of the invention to provide a field-effect transistor fabrication process in which a permanent secondary mask element is used.

It is another object of the invention to provide a field-effect transistor fabrication process in which a dielectric (masking) material permanent secondary mask element is used.

It is another object of the invention to provide a field-effect transistor fabrication process in which a secondary mask element is used to reduce processing steps used in achieving non-alloyed ohmic contacts.

It is another object of the invention to provide a field-effect transistor fabrication process in which a permanent secondary mask of silicon nitride or silicon dioxide is used to enable selective removal of an ohmic contact layer in the device gate region prior to gate metal deposition.

It is another object of the invention to provide a field-effect transistor fabrication process in which a permanent secondary mask of silicon nitride or silicon dioxide is used to protect source and drain regions ohmic connection layer material during gate region etching.

It is another object of the invention to provide a field-effect transistor fabrication process which is relatively insensitive to process-induced variations and therefore provides material growth characterization capability.

It is another object of the invention to provide a field-effect transistor fabrication process which provides consistent low resistance electrical contacts within a wafer and between wafers.

It is another object of the invention to provide a field-effect transistor fabrication process in which electrical contact alloying problems and resulting contact variability are overcome.

It is another object of the invention to provide a field-effect transistor fabrication process which employs the controllability of a selective etching process in the gate region formation.

It is another object of the invention to provide a field-effect transistor fabrication process which eliminates a critical alignment step usually encountered during gate defining and locating through the formation of ohmic contacts and gate region metalizations during a common step.

It is another object of the invention to provide a field-effect transistor fabrication process in which common metalization for source drain and gate elements is combined with non-alloyed ohmic contacts and a plural mask (one permanent) fabrication arrangement.

Additional objects and features of the invention will be understood from the following description and claims and the accompanying drawings.

These and other objects of the invention are achieved by a single metal method for completing the electrical contacts of a high electron mobility/pseudomorphic high electron mobility gallium arsenide field-effect transistor of less than six tenths micron feature size in a wafer having a substrate-supported initial plurality of gallium arsenide-inclusive semiconductor material layers, including an uppermost channel layer, said method comprising the steps of:

growing a gallium arsenide-inclusive semiconductor barrier layer over said channel layer;

depositing a permanent thin etch stop layer of metallic arsenide material over said semiconductor barrier layer;

isolating a lateral area of said wafer including said initial, said grown and said deposited wafer layers into individual transistor active areas;

forming a gallium arsenide-inclusive ohmic connection layer over portions of said permanent thin etch stop layer in said individual transistor active areas of said wafer;

covering said wafer including said active area ohmic connection layer portions and exposed portions of said permanent thin etch stop layer with a permanent secondary mask and passivation material layer;

etching through said permanent secondary mask and passivation material layer to said ohmic connection layer at a first temporary photoresist mask layer-defined gate window location of each transistor of said wafer;

removing said first temporary photoresist mask layer and covering said underlying permanent secondary mask and passivation material layer and said now exposed gate region ohmic connection layer of each transistor with a second and an outermost third temporary photoresist mask layers, said second and third temporary photoresist mask layers having ultraviolet/electron beam and optical masking properties respectively;

opening source and drain recess apertures through said second and third temporary photoresist mask layers of each said transistor using an exposure and etching sequence, said source and drain recess apertures extending down to said permanent secondary mask and passivation material layer;

dissolving said outermost third photoresist layer from coverage of said second photoresist layer;

defining a gate aperture position and gate aperture size in said second photoresist layer in said gate window location using an electron beam lithography exposure and development sequence;

etching a gate contact recess aperture through said ohmic connection material layer at said gate aperture position in said gate window location using a selective etch sequence, said gate contact recess aperture extending down to said permanent etch stop material-covered barrier layer;

said ohmic connection material underlying said source and drain locations being protected during said selective etching sequence by said permanent secondary mask and passivation material layer;

said selective etching sequence being halted in said gate contact recess aperture of said gate window location by said permanent thin etch stop layer of metallic arsenide material;

etching away said permanent secondary mask and passivation material layer down to said ohmic connection material layer in said source and drain locations, said etching away step simultaneously etching away said permanent thin etch stop layer of metallic arsenide material layer down to said gallium arsenide-inclusive semiconductor barrier layer in said gate contact recess aperture;

said second temporary photoresist mask layer covering said permanent secondary mask and passivation material layer surrounding said gate window location and said source and drain locations being inert to said etching away step;

depositing Schottky barrier contact metal over said gallium arsenide-inclusive semiconductor barrier layer in said gate contact recess aperture, over said ohmic connection material layer in said source and drain locations, and incidentally over said second temporary photoresist mask layer around said gate window location and around said source and drain locations, said Schottky barrier contact metal forming a nonlinear Schottky barrier electrical contact relationship with said buffer layer semiconductor material in said gate contact recess aperture and a non-alloyed linear ohmic contact electrical relationship with said ohmic connection semiconductor material layer in said source and drain locations;

removing said second temporary photoresist layer from said wafer, said removing simultaneously performing a metal lift-off clearing of Schottky barrier contact metal around said gate window and said source and drain locations of said transistor.

DETAILED DESCRIPTION

Figure 1:
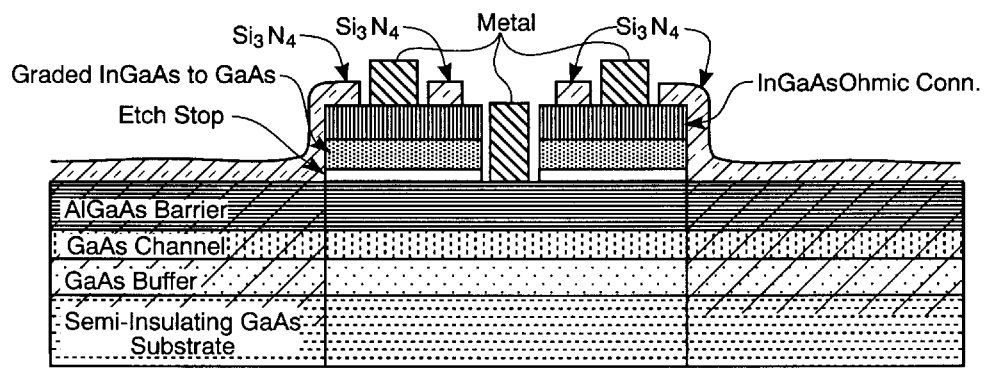
FIG. 1 shows a cross sectional layer view of a High Electron Mobility Transistor (a HEMT) in accordance with the invention.
Figure 2:
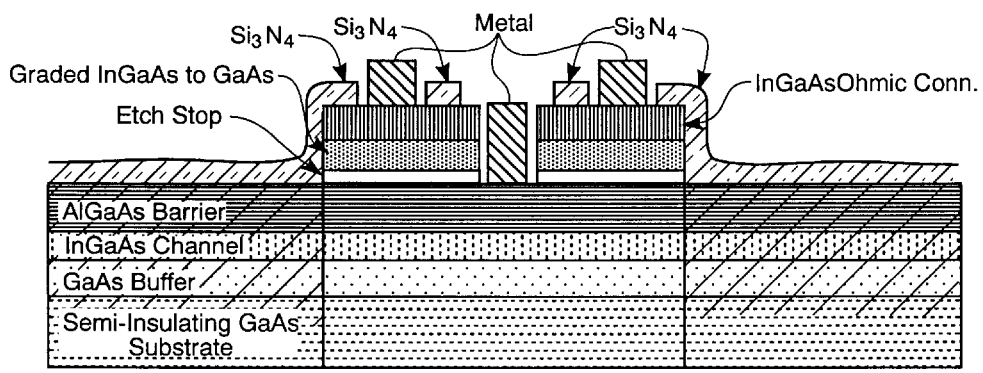
FIG. 2 shows a cross sectional layer view of a pseudomorphic High Electron Mobility Transistor (a pHEMT) in accordance with the invention.

FIG. 1 in the drawings shows a cross sectional layer view of one type of field-effect transistor, a High Electron Mobility Transistor (a HEMT) having certain attributes in accordance with the present invention. FIG. 2 in the drawings shows a cross sectional layer view of another type of field-effect transistor, a pseudomorphic High Electron Mobility Transistor (a pHEMT) also having certain attributes in accordance with the present invention. The structural cross section appearance of these two transistors is similar since they differ primarily in the nature of semiconductor material used in the charge carrier-conveying or channel layer of the device. Both of these device types may therefore be structurally represented by a common drawing as is accomplished in the FIG. 3 series of drawings in which fabrication details of a device according to either of these transistor types are disclosed.

Figure 3A:
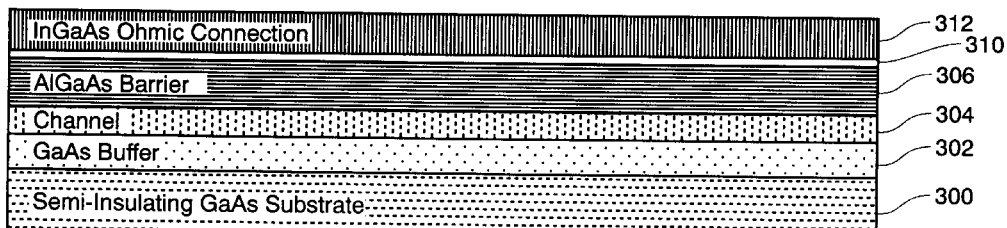
FIG. 3a shows an initial structure usable to achieve the FIG. 2 field-effect transistors.

The phrasing "in the FIG. 3 series of drawings" or more simply the term "FIG. 3" is used to refer collectively to the several views of FIG. 3a through FIG. 3m herein; a "FIG. 3" identification in support of this usage also appears adjacent the FIG. 3a view. For reasons of drawing practicality little attempt is made to show the layers of the FIG. 1, FIG. 2, and FIG. 3 devices or the transistor structure of other drawings herein to realistic horizontal or vertical scales. Layer thickness dimensions which range between numeric values of zero and five thousand for example can not be realistically represented in a drawing of the FIG. 3 type. Layer thickness dimensions are however shown numerically in the table disclosed below.

As may be appreciated from a close examination of the FIG. 1 and FIG. 2 transistors the present invention is especially concerned with the uppermost several layers of a field-effect transistor and the lower layers are largely determined by the type of transistor structure being provided with these upper layers. As may be further implied from this upper layer concern the present invention may be used with a variety of different underlying field-effect transistor types. The FIG. 1 and FIG. 2 transistors are for example disclosed to be transistors of a particular type, and transistors fabricated with gallium arsenide based materials; the invention is however, believed compatible with several different transistor types and especially with the transistor types which lend to fabrication with other periodic table group III–V materials.

As will become more apparent in the paragraphs following, the present invention is especially concerned with both the metalization portions of the FIG. 1 and FIG. 2 transistors and with the fabrication steps used to achieve this metalization. In view of this aspect of the invention, transistor devices which are in accordance with the invention have been referred to by the inventors identified herein and their colleagues by the name of a Single Layer Integrated Metal Field-Effect Transistor, i.e., a "SLIMFET". A SLIMFET device according to the invention may therefore combine the underlying structure of several different types of field-effect transistor with the single layer metalization and other details of the present invention.

In the interest of brevity the present invention is herein disclosed primarily in terms of the FIG. 1 and FIG. 2 devices and their latter stages of fabrication. Another arrangement of the invention using a different underlying transistor type and omitting certain of the FIG. 1 and FIG. 2 layers is the subject of other of the copending and incorporated by reference patent documents identified above. The FIG. 1 and FIG. 2 fabrication may commence with a multiple semiconductor layer substrate assembly as is shown in FIG. 3a of the drawings. Alternately however, this fabrication may be considered to include the processing steps accomplished on a semiconductor wafer up to the FIG. 3a state. As will become apparent shortly the FIG. 1 and FIG. 2 drawings are similar to the drawing for the final step of the FIG. 3 fabrication sequence with the exception of the FIG. 1 and FIG. 2 drawings including an additional semiconductor material layer and including more precise identification of the channel layer materials.

Fabrication of a HEMT or pHEMT device according to the present invention may therefore start with a wafer of semi-insulating semiconductor substrate material such as the substrate member 300 in FIG. 3a of the drawings or with a wafer having each of the several layers represented in FIG. 3a already formed or alternately may start with some intermediate status of a wafer such as a wafer having the substrate 300, the buffer layer 302 and the channel layer 304 previously formed for example. Wafers having all of the layers represented in FIG. 3a may be obtained to specification, e.g., the Table 1 specification below, or as standard products from several suppliers to the integrated circuit art. Suppliers such as Picogiga Corporation and QED Incorporated may be used as a source of such wafers. Wafers having some intermediate number of predisposed layers should also be available from such sources. Selection from these starting point options is therefore primarily a matter of available resources and economic considerations.

In the FIG. 3a view of a wafer segment a field-effect transistor channel layer 304 is shown to be received on a buffer layer 302 which is supported by a substrate 300. This channel layer is in turn covered by a barrier layer 306, a thin but permanent etch stop layer 301 and ohmic contact layer 312. The layers of the FIG. 3a wafer 314 may be comprised of the materials indicated in the FIG. 3a drawing and may have the thickness, doping levels and other characteristics indicated in Table 1 below.

TABLE 1

| Line No. | Purpose | Material Mole Fraction | Doping Concentration (cm$^{-3}$) | Layer Thickness | FIG. 3a Reference |
|---|---|---|---|---|---|
| 1. | Ohmic Contact | InAs | n-type Si $1 \times 10^{19}$ | 150 Å | 312 |
| 2. | Ohmic Contact | InGaAs X = 0.520 ungraded | n-type Si $5 \times 10^{18}$ | 400 Å | 312 |
| 3. | Ohmic Contact | GaAs | n-type Si $5 \times 10^{18}$ | 15 Å | 312 |
| 4. | Etch Stop | AlAs | n-type Si $5 \times 10^{17}$ | 30 Å | 310 |
| 5. | Barrier Layer | AlGaAs X = 0.24 | n-type Si $5 \times 10^{17}$ | 225 Å | 306 |
| 6. | Delta Doped | | n-type Si $4 \times 10^{12}$ | 0 Å | 306 |
| 7. | Spacer Layer | AlGaAs X = 0.24 | undoped | 40 Å | 306 |
| 8. | FET Channel | InGaAs X = 0.22 | undoped | 125 Å | 304 |
| 9. | Buffer | GaAs | undoped | 4975 Å | 302 |
| 10. | Superlattice Buffer | AlGaAs X = 0.24 | undoped | 30 Å | 302 |
| 11. | Superlattice Buffer | GaAs | undoped | 30 Å | 302 |
| 12. | Buffer | GaAs | undoped | 500 Å | 302 |
| 13. | Substrate | GaAs | semi-insulating | | 300 |

As may be already apparent to persons skilled in the gallium arsenide field-effect transistor art and also apparent from a brief consideration of the several layers represented in the lines of Table 1, certain additional routine or standard layers in addition to those shown in FIG. 3 are often used in the fabrication of a HEMT or pHEMT device. These additional layers may also include for example the FIG. 1 represented graded layer located intermediate the barrier layer 306 and the etch stop layer 310. Such a graded layer is helpful in enabling charge carriers to transition from the lightly doped semiconductor material of the barrier layer 306 to the very heavily doped semiconductor material of the ohmic contact layer 312 for example. Since the physical and fabrication nature of this graded layer, and additional other routine or standard layers which may be used in a HEMT or pHEMT device, is dependent on process related considerations, i.e., on the equipment and step variations which are commonly used by different suppliers, such routine or standard layers are omitted in the FIG. 3 drawing. Indeed two such possible fabrication arrangements for another layer of the FIG. 1, FIG. 2 and FIG. 3 devices, the ohmic contact layer 312 appear worthy of mention as an example of alternate fabrications at this point.

The graded ohmic contact layer 312 may be fabricated using the gas-based analog-like metal organic chemical vapor deposition, (MOCVD) process. In such a fabrication arrangement the gas concentrations are continuously varied as the layer is formed so that the composition of the layer varies along its top to bottom dimension. The ohmic contact layer 312 may also be formed using the more digital-like molecular beam epitaxy or MBE process, (which is implied in Table 1) through the mechanism of forming a series of thin layers of varying composition, i.e., through the formation of a plurality of superlattice layers.

Notwithstanding the expediency of FIG. 3 omitting standard layers, Table 1 above indicates the identity and characteristic of each actual layer including layer gradations which have been found convenient in a starting-point wafer using the processing equipment and expertise available to the present inventors. In Table 1 the layers indicated at line numbers 1, 2, and 3 therefore actually comprise the grading which may be used in forming the ohmic contact layer 312 even though the latter two of these layers is not expressly shown in the FIG. 3 drawings. The FIG. 3 drawings and the descriptions relating thereto in this document may therefore be viewed as showing the essential steps and the essential layers in a present invention fabrication sequence.

In a related manner the recitation of routine or standard layers in the claims of this document is considered to be an undue limitation of the scope of these claims, especially in instances wherein an alternate arrangement transistor, a transistor including alternate routine or standard layer structure, could be asserted to avoid claims reciting different or no standard layers. Several of the claims appended to the present specification therefore also omit routine or standard layer language and are couched in terms of what is deemed to be essential steps and essential layers language.

Before departing from the subject of Table 1 it appears worthy of note that the information in this table represents a specification for fabrication of the FIG. 3a starting point structure using a particular array of processing equipment and expertise. The layers recited in this Table 1 data may be of a single crystal nature. Table 1 by reason of this single crystal and MBE formation foundation does not include certain later occurring additional structure such as primary and secondary masking layers, metalization layers or ion implant isolation regions in its contents; these additions are of course not of MBE origin, nor of a single crystal nature. Such additional structure is described below in connection with the FIG. 3 sequence of steps.

A close comparison of the thirteen lines or thirteen different steps disclosed in Table 1 with the six layers shown in the FIG. 3 drawings however, suggests another absence of one to one comparison between a Table 1 layer and a FIG. 3 layer, an absence which is in addition to the above noted omission of routine or standard layers from the FIG. 3 drawing; i.e., several Table 1 layers or fabrication steps are involved in the fabrication of certain other FIG. 3 layers. To better illustrate this point FIG. 4 in the drawings shows a FIG. 3a-like drawing in which each of the layers recited in Table 1 is expressly shown.

Three groups of Table 1 steps, steps commencing with the above explained ohmic contact-related steps (which are numbered lines 1, 2 and 3 in Table 1), are particularly notable in this another absence of one to one layer comparison regard. Second and third groups of multiple steps relating to a single layer also appear in the line number 5, 6 and 7 steps and the line number 9, 10, 11 and 12 steps in Table 1; these steps relate to the barrier layers 306 and to the buffer layer 302 in FIG. 3a respectively. The rightmost column in Table 1 shows a step to FIG. 3 layer relationship for each of the thirteen steps in Table 1.

Although the purpose of each step in Table 1 (i.e., the contribution to transistor function which results from each step of this table) will be apparent to those skilled in the transistor fabrication art, the following brief description of these step to function relationships may also be helpful. The etch stop layer of step 4 in Table 1 is used to protect the underlying gallium arsenide graded layer from removal or attack during removal of the ohmic contact layer 312. The barrier layer of step 5 is useful to confine charge carriers to the channel layer 304 of the FIG. 3 transistor. The delta doped layer of step 6 in Table 1 is located in the barrier layer and serves to provide carriers in the completed FIG. 3 transistor.

The spacer layer of step 7 in Table 1 serves to reduce carrier scattering by physically separating the channel layer from the carrier supply layer. The channel layer of step 8 in Table 1 is the location of charge carrier flow between source and drain of the FIG. 3 transistor. The buffer layer 302 of FIG. 3 serves as a crystallographic interface between the lattice structure of the substrate member 300 and the differing lattice structure of the channel layer 304. To accomplish this interface however, it is desirable to use a multiple layer fabrication sequence as shown in lines 10–12 of Table 1. The multiple layers of this sequence act as a buffer from the substrate in order to achieve high quality layer growth. The invention uses highly doped InGaAs layers or other low energy bandgap material compatible with the underlying FET layers as the cap layer or ohmic contact layer 312 to form non-alloyed ohmic contacts using known Schottky refractory metalization procedures. The wafer 314 also includes an etch stop layer, represented at 310, in order to control a later-described etch operation.

Figure 3B:
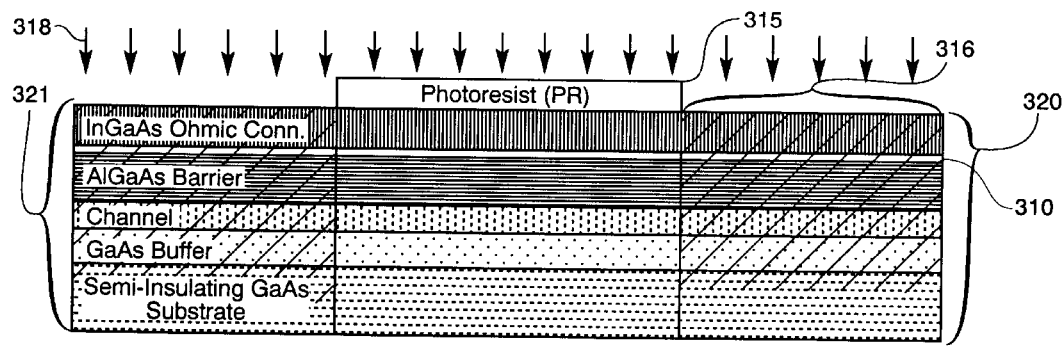
FIG. 3b shows the FIG. 3a structure after an additional processing step.
Figure 3C:
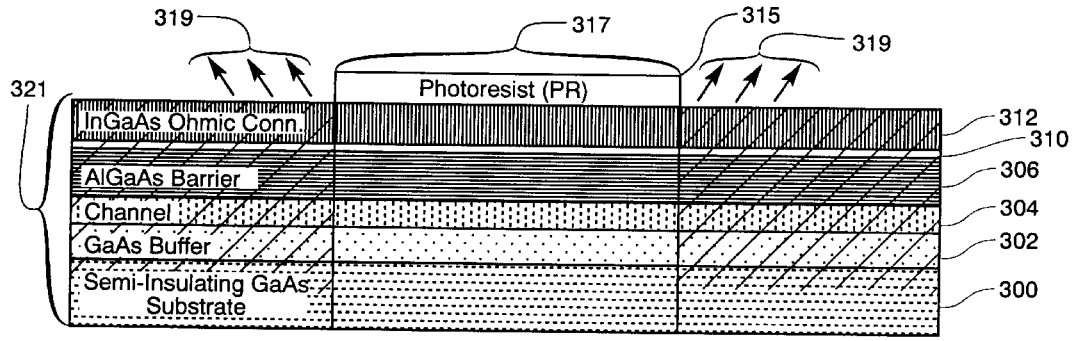
FIG. 3c shows the FIG. 3b structure after an additional processing step.

Continuing with a discussion of the other drawings in the FIG. 3 series, an ion implantation-accomplished electrical isolation of adjacent transistors on a wafer, an implantation as represented at 318 in FIG. 3b, may be used to achieve adjacent transistor electrical isolation in the layers below ohmic contact layer 312. Such implanting, with oxygen ions for example, is preferably accomplished through use of the single dual use mask indicated at 315 in FIGS. 3b and 3c—in order to avoid a tedious and error prone mask realignment step. FIG. 3b in the drawings therefore shows the addition of the lithographically configured photoresist mask 315 over the ohmic contact layer 312 of FIG. 3a. This dual use mask 315 may be made of the photoresist materials PMGI and 1813 made by Micrographic Chemical Corporation (MCC) and by Shipley Corporation of Newton, Mass. and Marlborough, Mass. respectively. The multiple-layered isolation regions achieved by such ion implantation are shown at 320 and 321 in FIG. 3b.

By way of additional explanation, since the InGaAs of the ohmic contact or ohmic connection layer 312, once formed in its heavily doped and electrically conducting condition, is not easily made non-conducting even by this oxygen ion implanting sequence, an actual removal of this ohmic contact layer 312 material in the isolation regions between adjacent transistors of the wafer is desirable. This removal also removes the etch stop layer material in the non-active areas of the of the device. Several techniques for removing these materials are available. Standard photolithography processes which define the desired transistor active region 317 by way of the mask 315 and enable a selective mesa isolation wet etch in the non active heavily doped regions 316 can for example be used. Removal of the ohmic contact and etch stop layers 312 and 301 is indicated at 319 in FIG. 3c. The appearance of the ion implanted regions 320 and 321 after removal of implant region portions of the ohmic contact layer 312 and etch stop layer 301 is shown at 324 and 326 in FIG. 3d. The photoresist mask 315 has also been removed in the FIG. 3d drawing.

Figure 3D:
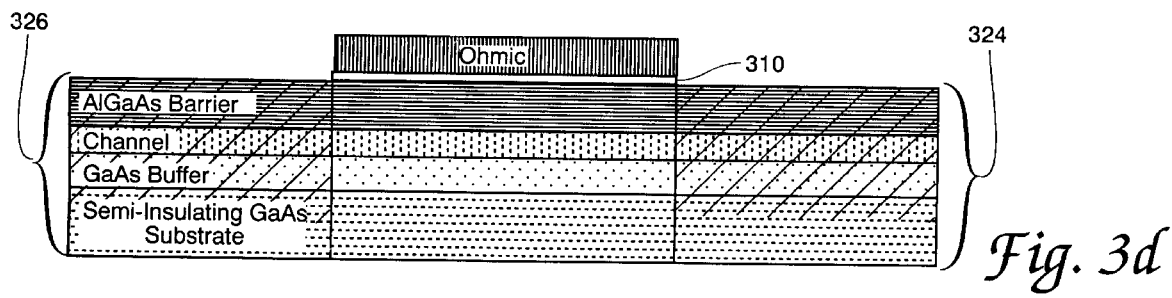
FIG. 3d shows the FIG. 3c structure after an additional processing step.
Figure 3E:
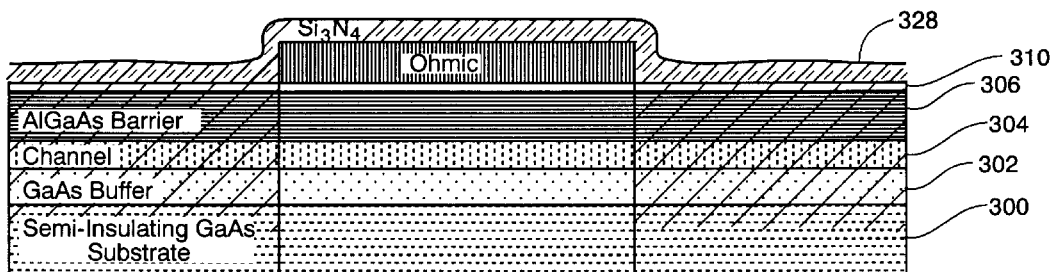
FIG. 3e shows the FIG. 3d structure after an additional processing step.

FIG. 3e shows the deposition of a secondary mask material layer 328 over the FIG. 3d structure. This secondary mask layer is preferably made from silicon nitride or silicon dioxide material or other dielectric materials of similar type in order to provide non-photoresponsive, acceptable permanence and relative temperature immunity characteristics in the secondary mask layer 328. These are also materials which can be selectively removed from specific areas of the secondary mask layer 328 without harm to adjacent portions of the transistor in a later portion of the fabrication sequence. Use of another semiconductor material for the secondary mask, a material used in lieu of the silicon nitride or silicon dioxide material identified here, is disclosed in other of the above-identified copending patent documents. As is suggested by use of this semiconductor material in the secondary mask it is not essential that the secondary mask element be composed of dielectric material.

The secondary mask layer 328 serves as a combination of a fabrication material for a mask used in a subsequent transistor fabrication step, as a selectively removable masking material which is nonresponsive to photoresist mask removal materials, as a heat resistant electrical insulator on which metallic conducting material can be deposited and as a permanent covering layer which is not detrimental to performance in the completed transistor. Since a major part of this secondary mask layer 328 remains in the finished transistor, it also provides a desirable degree of passivation and protection of the completed transistor's exposed surface (i.e., in the non-metal covered surface portions) from contamination and physical damage and also can provide the electrical insulation/dielectric material for capacitors of the metal-insulator-metal type used in conjunction with the fabricated field-effect transistor. For present discussion purposes the masking one of these secondary mask layer 328 functions is of primary interest. Indeed without the masking capabilities arising from this secondary mask layer 328, and especially the later described assistance of such a mask in precluding another critical mask realignment operation, the benefits of the present invention could not be achieved.

The secondary mask layer 328 may be deposited using a plasma enhanced chemical vapor deposition (PECVD) sequence and is preferably deposited to a thickness of five hundred Angstroms. This secondary mask layer 328 is often referred to herein as a secondary mask layer, such references being in relation to its function in the fabrication sequence of protecting the field-effect transistor ohmic layer during gate window recess etching. Notably in the presently described embodiment of the invention the mask secondary mask layer 328 is omitted from the Table 1 described layers of the transistor as is indicated above. In another of the above identified six copending patent documents an alternate semiconductor material composition for the secondary mask layer 328 is disclosed along with recitation of certain advantages it provides.

Figure 3F:
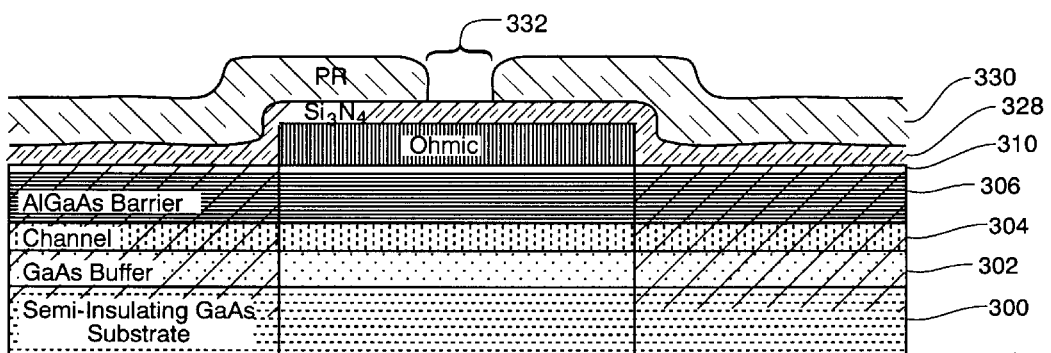
FIG. 3f shows the FIG. 3e structure after an additional processing step.
Figure 3G:
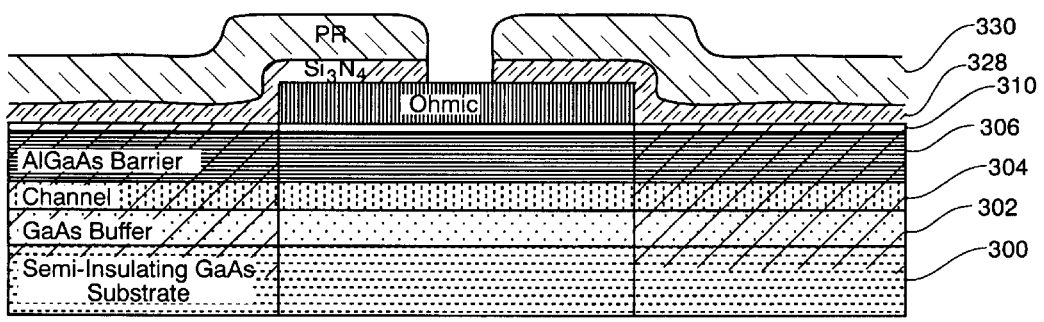
FIG. 3g shows the FIG. 3f structure after an additional processing step.

FIG. 3f of the drawings shows a photoresist layer 330 to be added to the FIG. 3e structure and a gate recess aperture or gate window opening 332 to have been formed photolithographically in this photoresist layer. The recess aperture 332 of course provides access to the secondary mask layer 328 in order that it can be removed from the gate window area during a subsequent selective etching. Removal of the secondary mask layer 328 material in the recess aperture 332 to leave the desired gate window recess in the secondary mask layer 328 and accomplish exposure of the ohmic contact layer 312 material is represented in FIG. 3g. The photoresist layer 330 may be composed of the above identified 1813 photoresist material. A buffered oxide etch (BOE)solution is used to remove the secondary mask layer 328 in the 330; this solution may be composed of BOE and water using the volumetric ratio of one to one. The BOE solution may be composed of one part hydrofluoric acid and seven parts ammonium fluoride and may be purchased or locally mixed.

Figure 3H:
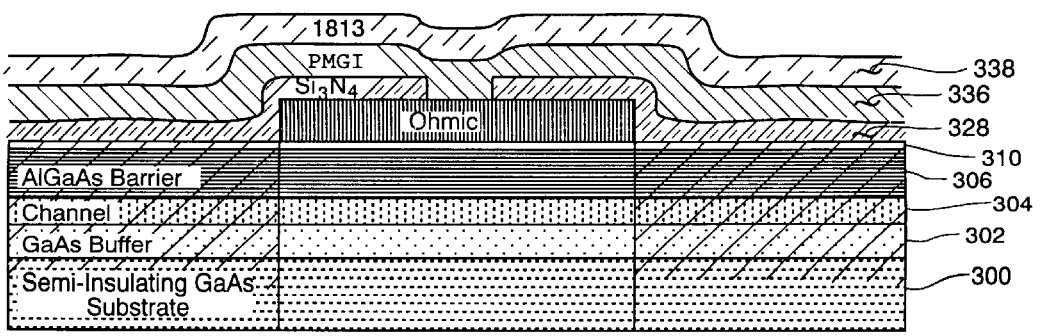
FIG. 3h shows the FIG. 3g structure after an additional processing step.
Figure 3I:
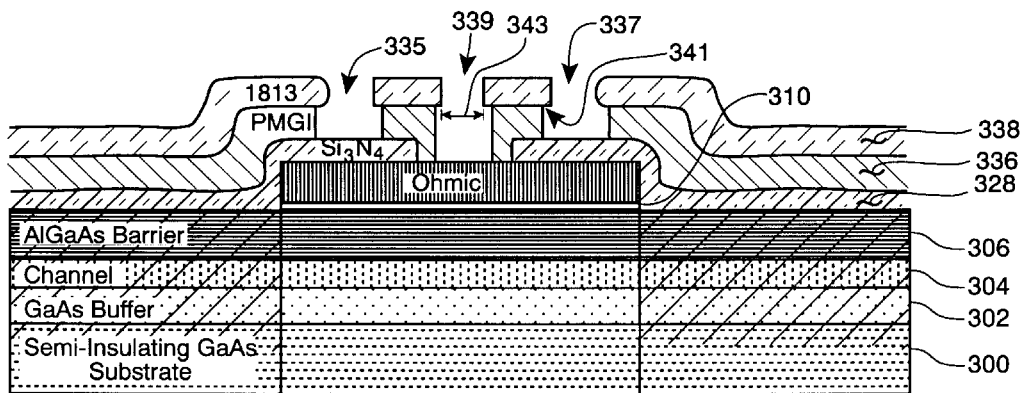
FIG. 3j shows the FIG. 3i structure after an additional processing step.
FIG. 3k shows the FIG. 3j structure after an additional processing step.
FIG. 3l shows the FIG. 3k structure after an additional processing step.
FIG. 3m shows the FIG. 3l structure after an additional processing step.

Next in what may be described as the present large feature or optical lithography gate region arrangement of the invention the photoresist layer 330 is removed and two new and differing layers 336 and 338 of photoresist are applied to the FIG. 3g structure. The results of this application are represented in FIG. 3h of the drawings. A photoresist material such as the type 1813 is suitable for the upper layer 338 in FIG. 3h. A photoresist material such as the type PGMI resist is suitable for the lower layer 336. The PGMI photoresist layer 336 is of course applied first to the FIG. 3h structure. A large feature arrangement of the invention is generally considered here to mean a transistor having a gate region in which the smallest defined feature or the smallest desired dimension is of at least six tenths of a micron in dimensional size. An electron beam exposure-based accomplishment of the invention for gate region dimensions smaller than this six tenths of a micron is described below herein and is considered to represent an alternate arrangement of the invention.

Figure 3J:
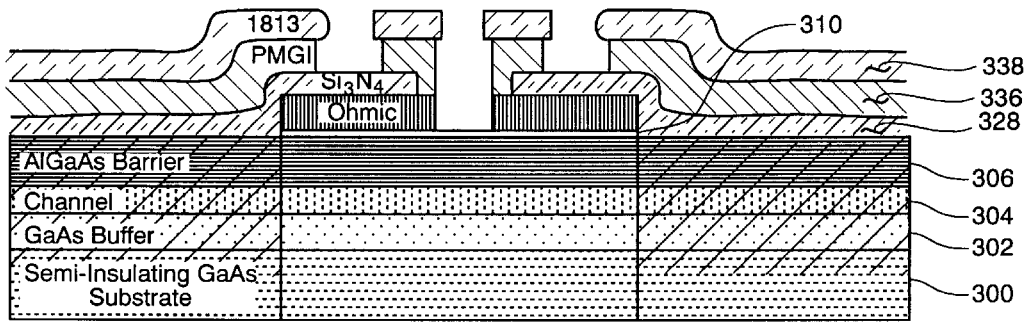

The formation of photolithographically defined source contact and drain contact apertures 335 and 337 (respectively for example) in the photoresist layers 336 and 338 is indicated in FIG. 3j of the drawings. In addition to these source contact and drain contact areas, the FIG. 3j step may also form interconnect metal areas on the secondary mask layer 328 of the transistor. The FIG. 3j step also represents the definition of gate geometry, i.e., the gate length and gate width dimensions of the transistor in the aperture 339 . (Gate "length" here is presumed, according to convention, to extend in the direction of charge carrier flow or from left to right or right to left in FIG. 3j.) Source and drain elements in a field-effect transistor are of course often electrically interchangeable hence the use of nonspecific references to these elements in the language herein.

Notably the gate geometry definition in the FIG. 3j step is accomplished on the ohmic contact layer 312 while the source and drain definitions occur on the secondary mask layer 328. It is also notable that the developing and removal of mask aperture areas represented in FIG. 3j have also been used to accomplish the upper mask lip or overhang or cliff region 341 in FIG. 3j. This overhang region assures the presence of metal breaks which are useful in separating desired gate source and drain contact metal from undesired excess metal inherently deposited on the upper surface of the photoresist layer 338 during a later metal removal step of the fabrication process. As is known in the lithography art an over development of the image in the photoresist layer 336 may be used to achieve the lip or overhang or cliff region 341.

In the FIG. 3j drawing use of a selective etch step to remove a gate window sized aperture in the ohmic contact layer 312 is represented. Complete removal of the ohmic contact layer 312 down to the etch stop layer 301 is desired since the subsequently received gate metal should be formed on the barrier layer underlying the ohmic contact layer 312. This selective etch for the indicated indium gallium arsenide material of this layer may be accomplished using the citric acid/hydrogen peroxide etch process described in the four published papers of G. C. DeSalvo, G. C. DeSalvo, R. D. Remba and J. K. Abrokwah respectively. A timed selective etch is preferred for the aperture 339 ohmic material removal step indicated in FIG. 3j; both wet and dry etching is possible however, an etchant specifically composed of citric acid and hydrogen peroxide is preferred for gallium arsenide embodiments of the invention. The citric acid and peroxide etchant solution is preferably comprised of a citric acid to peroxide volumetric ratio of between 1: 1 and 7:1.

The four published papers of G. C. DeSalvo, G. C. DeSalvo, J. K. Abrokwah and R. D. Remba are identified as follows and are hereby incorporated by reference herein.

Etch Rates and Selectivities of Citric Acid/Hydrogen Peroxide on GaAs, $Al_{0.3}Ga_{0.7}As$, $In_{0.2}Ga_{0.8}As$, $In_{0.53}Ga_{0.47}As$, $In_{0.52}Al_{0.48}As$, and InP, authored by G. C. DeSalvo et al., and appearing at page 831 in the J. Electrochem. Soc., Volume 9, Number 3, March 1992.

Citric Acid Etching of $GaAs_{1-x}Sb_x$, $Al_{0.5}Ga_{0.5}Sb$, and InAs for Heterostructure Device Fabrication, authored by G. C. DeSalvo et al., and appearing at page 3526 in the J. Electrochem. Soc., Volume 141, Number 12, December 1994.

High-Performance Self-Aligned $p^+/n$ GaAs Epitaxial JFET's Incorporating AlGaAs Etch-Stop Layer, authored the J. K. Abrokwah et al., and appearing at page 1529 in the IEEE Transactions on Electron Devices, Volume 37, Number 6, June 1990.

Making a High-Yield, 0.33 Micron, MBE-Based GaAs MMIC Production Process, authored by R. D. Remba et al., and appearing at page 90 in the conference proceedings of the 1994 U.S. Conference on GaAs Manufacturing Technology (MANTECH), May 1994.

It is notable that the selective etch of FIG. 3j stops at the etch stop layer 310. This etch stop layer 301 is of course included in the FIG. 3 structure expressly for the purpose of accomplishing the FIG. 3j etch stop and protecting the underlying barrier layer from etch degradation. By way of this layer 310, the FIG. 3j etch is also made to be of a non time critical nature since the indicated aluminum arsenide material of the etch stop layer 301 is substantially unresponsive to the citric acid/hydrogen peroxide etch process. Since the etch rates of the indium gallium arsenide ohmic contact layer 312 is substantially faster than that of the aluminum gallium arsenide barrier layer 306 it is also possible to use these different etch rates to an advantage and avoid use of the etch stop layer 301 altogether. This absence of the etch stop layer 301 is considered to be a viable alternate arrangement of the invention. In any event it is particularly notable that the source and drain regions of the FIG. 3 transistor, the regions at 335 and 337 remain protected by the secondary mask layer 328 during this FIG. 3j timed selective etch step.

This protective function suggests, as indicated above, reference to the secondary mask layer 328 as a secondary mask layer. Identification of this protective function also enables a better understanding of the importance of the secondary mask layer 328 in achieving a transistor according to the present invention. Without the separate but jointly present in FIG. 3i and FIG. 3j masks for the regions at 335/337 and 339, a delicate mask realignment step and separate distinct metalization operations for these regions would be required—as is the present state of the field-effect transistor fabrication art. (It is particularly notable, for example, that the process of the above identified U.S. Pat. No. 4,961,194 of S. Kuroda et al., does not include the mask of layer 328 and does contemplate separate metalization steps). In addition to enabling a single common metalization step, the absence of a realignment step is particularly desirable in the gate region of a field-effect transistor since accurate gate placement is needed to obtain the intended performance from a fabricated device.

Figure 3K:
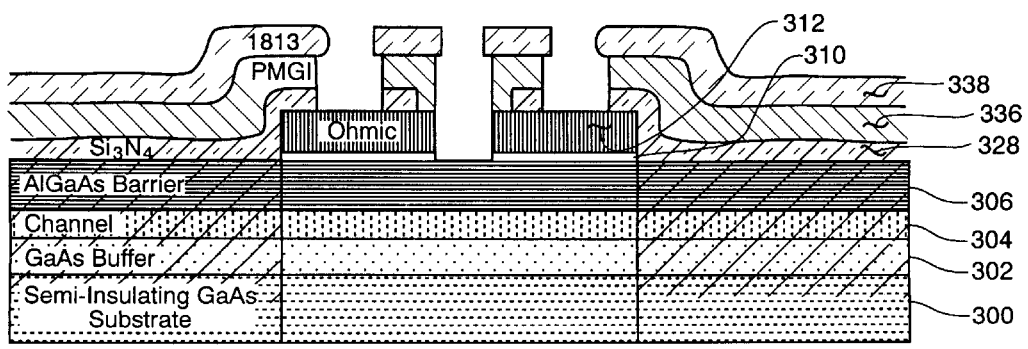

FIG. 3k represents accomplishment of a wet chemical etching of the secondary mask layer 328 to expose the ohmic contact layer 312 material of the source and drain regions in the transistor. Notably this same wet chemical etch also serves to remove the etch stop layer 301 in the aperture 339 (italics added for emphasis). A buffered oxide etchant solution is used for the FIG. 3k joint source/drain and gate etches. An etch solution composed of BOE and water with a ratio of one to one and available from Ashland Chemical Corporation may be used for this purpose. It is notable that this FIG. 3k etch step represents a selective removal of the indium gallium arsenide or the graded layers comprising the ohmic contact layer 312 from the gate region through the expediency of having included the secondary mask layer 328 in the FIG. 3 device and without use of a two step lithographic process.

Figure 3L:
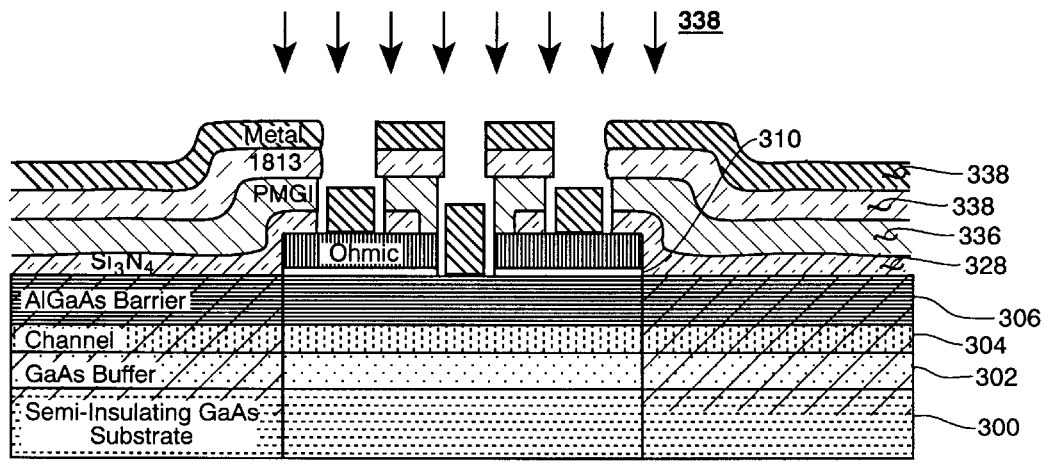

With the source/drain and gate regions of the FIG. 3k device exposed a single deposition of metal as represented at 340 in FIG. 3l can be accomplished. A metal scheme which includes titanium platinum and gold with the thicknesses of 200:500:5300 Angstroms respectively is typical for this purpose. Other metal combinations including palladium, germanium, nickel, chromium and tungsten may also be used in this step. It is significant to note that the gate length dimension is determined during the FIG. 3l metal deposition by the size of the 1813 mask material opening, by the dimension 343 in FIG. 3i.

By using small bandgap InGaAs as an ohmic contact epitaxial layer, and high bandgap AlGaAs for the gate contact semiconductor-layer, alloying of the deposited metal 340 at the source and drain contact areas is not required. Thus, a standard Schottky gate metalization scheme such as Ti/Pt/Au can be used to form the Schottky gate without appreciably raising the achieved ohmic contact resistance. Therefore by way of the differing semiconductor materials and doping concentrations present in the source/drain and gate regions of the device, i.e., present below the FIG. 3m metalizations, the desired ohmic contact electrical characteristics are obtained at the source/drain contact regions and a Schottky barrier electrical characteristic is obtained at the gate contact region with a single metalization step. Since the FIG. 3i photoresist pattern is used both as the gate recess etch mask in FIG. 3j and as the gate metal definition mask in the FIG. 3l step, the gate metal is self-aligned to the etched gate recess region on the transistor channel—as is also desired for achieving the optimum positioning which enables best transistor performance and yield.

The FIG. 3l metalization step also deposits metal over the top surface of the FIG. 3k structure, i.e., over the photoresist layer 338, and thereby may be used to form the transistor gate feed and pad regions and the interconnecting conductors of the transistor. For such interconnecting conductor formation it is necessary to have previously removed the photoresist layers 336 and 338 at the desired interconnect regions since a metal lift-off step is preferably used subsequently to remove any metal supported only by photoresist mask material.

Figure 3M:
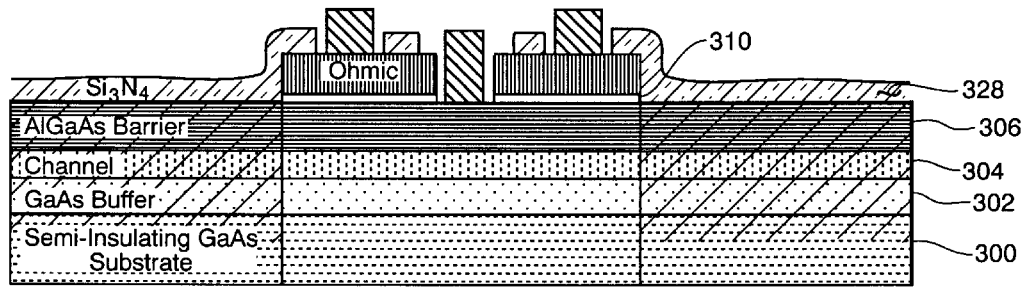

Removal of the photoresist layers 336 and 338 is represented in the FIG. 3m drawing. This removal accomplishes a lift-off separation of undesired metal from desired metal by way of the lip or overhang or cliff region 341 areas described previously. The device achieved after this metal lift-off includes non-alloyed contacts in the source/drain and gate regions of the transistor. These non-alloyed contacts are of course a result of the highly doped semiconductor material underlying the metal contacts. Following such metal lift-off the FIG. 3 device is complete and ready for known device incorporation procedures.

Figure 6:
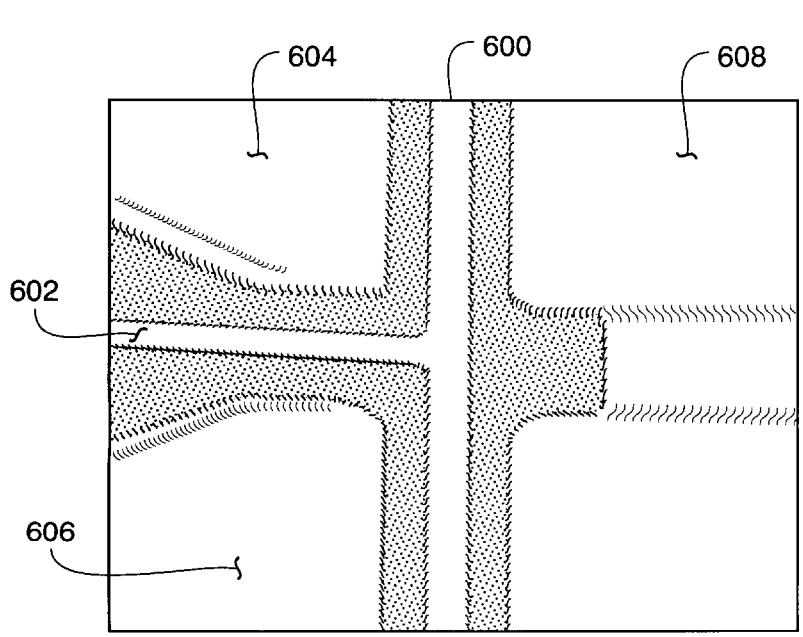
FIG. 6 shows a drawing representation of a top view microphotograph of a transistor according to the invention.

FIG. 6 in the drawings shows a scanning electron microscope view of a field-effect transistor device according this process. In FIG. 6 a center-tapped, center fed gate contact appears at 600, the gate feed conductor at 602, portions of the source contact for example at 604 and 606 and a drain contact at 608. The FIG. 6 drawing is a drafting rendition of an actual scanning electron microscope microphotograph.

Small Gate Geometry, Electron Beam Optical Lithography Processing

The fabrication sequence described thus far in this document has been based on use of optical exposures during lithography for all elements of the transistor, elements which significantly include the important gate contact and determination of its positional location within the source to drain space of the transistor. It is known in the device fabrication art however, that even ultraviolet light-based optical lithographic techniques as contemplated thus far herein are limited to feature sizes of about six tenth of a micron and larger since the wavelength of the optical energy employed in the lithography becomes a dimension-limiting factor. Electron beam-based lithography with its higher energy levels and therefore smaller wavelengths offers one alternative to this resolution limitation and enables achievement of the sometimes desired smaller features. This relief however, comes at the expense of device processing throughput speed since point by point beam scanning over the transistor features being defined is required in electron beam lithography and only limited scanning speeds are practical to achieve the needed photoresist exposures.

The combined use of electron beam-based lithography for small feature definitions, in a transistor gate region for example, together with optical or ultraviolet exposures for larger device features has been described in the two technical papers "Single-Cycle Lithography Process for Both Large and Sub-Half-Micron Features", J. S. Sewell et al.; SPIE vol 1671, (1992) page 177, and "A Combined Electron Beam/Optical Lithography Process Step for the Fabrication of Sub-Half-Micron-Gate-Length MMIC Chips", J. S. Sewell and C. A. Bozada NASA Conference Publication 3249, volume 1, page 54, (1993); papers which originate in the same United States Air Force laboratory as the present invention. An early predecessor of the J. S. Sewell et al. process is also described in the paper of Y. Todokoro et al. "A Hybrid E-beam/Deep-UV Lithography for GaAs FET's", SPIE Electron-Beam, X-Ray and Ion-Beam Lithographies VI, Vol. 773, Pages 54–60, 1987. Each of these technical papers is also hereby incorporated by reference herein.

Figure 5A:
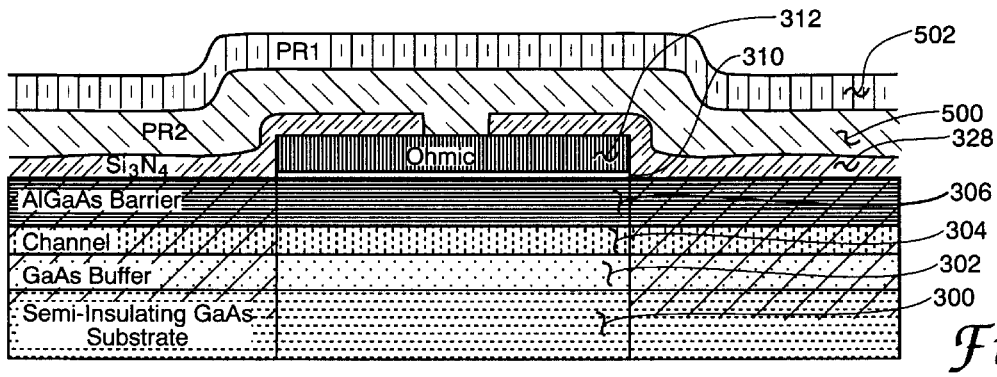
FIG. 5a shows an initial step in a small geometry alternate fabrication sequence for a FIG. 2 pHEMT field-effect transistor.

The electron beam inclusive process disclosed in these papers has been identified by the name of the Electron Beam Optical Lithography process, the "EBOL" process, by the authors and present users. This process diverges from the FIG. 3-described sequence immediately prior to the FIG. 3h step. In other words, the earlier FIG. 3 steps, as shown in FIG. 3a through FIG. 3g, are accomplished on the transistor and then the processing described in the FIG. 5 drawings is employed. This FIG. 5 sequence commences with deposition of differing photoresist layers as is shown in FIG. 5a of the FIG. 5 drawings. This EBOL process uses optical photolithography for features greater than 0.6 micron in size, deep ultraviolet (UV) lithography for features between 0.6 micron and 0.4 micron, and the slower but more accurate and high resolution electron beam lithography for features between 0.4 micron and 0.05 micron. The EBOL process therefore combines optical photolithography and electron beam lithography into an optimized single optical/electron beam lithographic process step.

Three different types of photoresist material formed into four distinct layers are used in the FIG. 5a step. Three of these different types of photoresist are used in the electron beam exposure sequence and consist of related material types and are therefore shown as a single layer, the layer 500, in FIG. 5a. The fourth photoresist layer is used for the optical portion of the EBOL process and is represented as the layer 502 in FIG. 5a. This somewhat elaborate procedure provides one arrangement for fabricating the mushroom gate structure of low parasitic inductance and gate resistance that is desirable in many transistors made in accordance with the invention. Other photoresist arrangements for forming a mushroom gate structure including arrangements requiring fewer layers of photoresist material are believed available from other manufacturers. However the arrangement disclosed herein has been found compatible with the apparatus available to the present inventors and to provide satisfactory transistors. The low electrical inductance and low gate resistance characteristics of a mushroom gate structure are particularly desirable in transistors intended for use in microwave, millimeter wave and other high frequency applications of the fabricated transistor.

The photoresist layer shown at 500 in FIG. 5a consists of a bottom-most film of PMMA (polymethylmethacrylate) photoresist material, an intermediate film of copolymer photoresist material and a third layer of additional PMMA photoresist material. A major consideration in the use of these three layers involves need for photoresist materials of differing exposure sensitivity in order to define the mushroom gate structure using a dosing modulation arrangement; another consideration involves accomplishment of the FIG. 5 embodiment of the above described metal lift-off enabling lip or overhang or cliff region 341 in the upper photoresist layer. Additional explanation of this procedure is provided below. The fourth photoresist layer of the FIG. 5a device is the illustrated layer 502 and is composed of type 1400–27 photoresist. The PMMA photoresist material is available from Microlithography Chemical Corporation, MCC, of Newton, Mass.; the copolymer photoresist material is available as a type p(MMA-MAA) photoresist from MCC; the type 1400–27 photoresist was formerly available from Shipley and is believed now available from other suppliers known in the integrated circuit art.

After the FIG. 5a photoresist layers are in place optical lithography exposures, performed with an optical aligner apparatus, are used to define source/drain, gate feed, optical pad and interconnect regions in the photoresist layers 500 and 502. The source and drain portions of this definition are indicated at 504 and 506 in FIG. 5b of the drawings where the optically exposed regions appear shaded. These large feature portions of the FIG. 5 transistor are defined optically in order that their exposure is accomplished "in parallel" and thereby as rapidly as possible. The FIG. 5b optical lithography exposure of the layers 500 and 502 each for the source and drain contacts (italics added for emphasis) are accomplished at two different times (i.e., a different time for each layer) and involve two different ultraviolet wavelengths as is described below. Electron beam exposure of the same layer 502 for gate contact formation occurs subsequently.

Figure 5B:
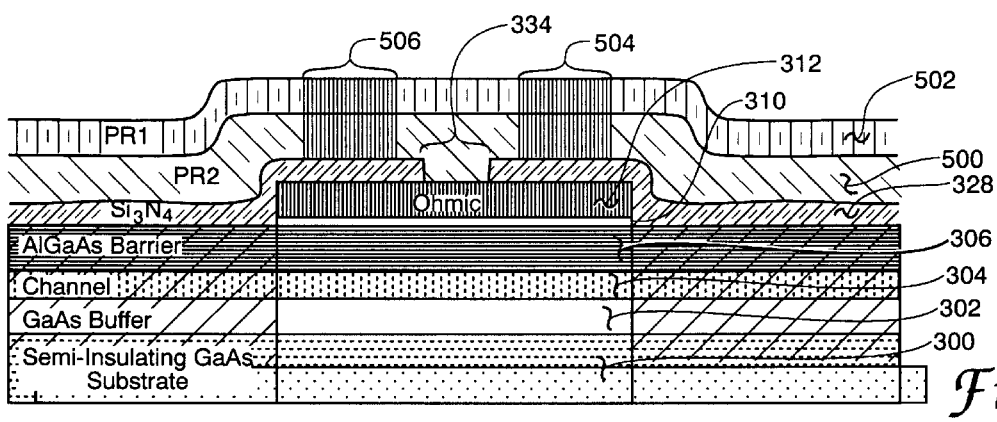
FIG. 5b shows the FIG. 5a structure after an additional processing step.
Figure 5C:
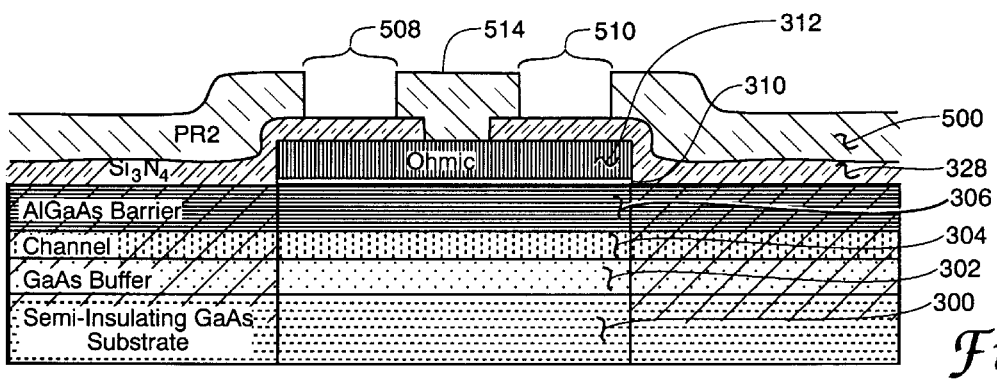
FIG. 5c shows the FIG. 5b structure after an additional processing step.

The FIG. 5b exposure commences with a longer ultraviolet wavelength exposure of the uppermost layer 502 in the source and drain regions 504 and 506 followed by development removal of the exposed photoresist material. The type 1400–27 photoresist material of layer 502 is responsive to a longer ultraviolet light wavelength of 405 nanometers. After development of the layer 502 exposed regions the resulting apertures at 504 and 506 are then used as masks for defining a short wavelength ultraviolet exposure of the underlying layer 500 again in the regions 504 and 506. The electron beam responsive PMMA photoresist material of layer 500 (i.e., the three films of the layer 500) is, in addition to its electron beam response, also responsive to an ultraviolet light wavelength of 265 nanometers, a shorter ultraviolet wavelength used for this exposure.

Following this two wavelength ultraviolet light exposure sequence a double removal step is performed. In this double removal the remaining upper photoresist layer 502 is removed and simultaneously the exposed PMMA photoresist films of the layer 500 are etched away. The results of this double removal appear in FIG. 5c of the drawings where the source and drain apertures 508 and 510 are shown to extend down to the secondary mask layer 328. This double removal step is performed with a photoresist solvent material, preferably acetone. The layer 502 photoresist material is not affected by this acetone removal because of low dissolution rates on exposed electron beam resist. Although this double removal action is convenient and provides satisfactory results in the present sequence it is possible that an uncoupling of the two actions it accomplishes may be desirable in some circumstances, circumstances such as. Both the photoresist materials and the photoresist reactant materials to permit this uncoupling are believed to be now or shortly in the future available from suppliers to the integrated circuit art such as MCC or Shipley. Either the coupled or uncoupled arrangement of this removal is therefore considered to be within the spirit of the invention.

Figure 5D:
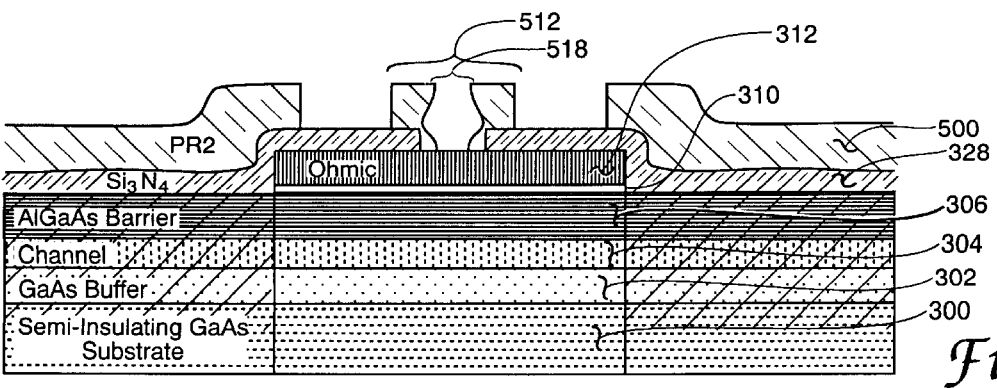
FIG. 5d shows the FIG. 5c structure after an additional processing step.

The FIG. 5d step represents the definition of gate geometry, i.e., the gate length and gate width dimensions of the FIG. 5 transistor. (Gate "length" here is again presumed, according to convention, to extend in the direction of charge carrier flow, e.g., from left to right in FIG. 5d.) In the desired high resolution electron beam gate definition procedure this gate contact geometry including its FIG. 5d cross sectional shape is defined by the manner in which an electron beam is scanned over the photoresist mask area 514 in FIG. 5c. A scanning pattern which will achieve the "top-heavy" mushroom-like gate cross-section described above is desired.

A number of different scanning patterns can be used to achieve the depicted small footprint and larger top-most portions of such a low electrical resistance and low electrical inductance mushroom-like gate contact shape. In the presently preferred of these scanning patterns the electron beam is moved linearly to define the lowermost regions of the gate aperture, to expose lowermost parts of the photoresist mask area 514 in the gate window 334, and moved over a selected two dimensional pattern in the "tophat" or "sidelobe" areas of the gate contact. Such a pattern is effective in achieving a shape of the type illustrated in FIG. 5d. A connected series of small rectangle shapes is found to be satisfactory for this "tophat" or "sidelobe" areas electron beam exposure.

The development used in this instance involves a Methyl Iso Butyl Keytone and Isopropyl Alcohol, MIBK:IPA, developer mixture or may use a chlorobenzene developer. This developer is active on the P(MMA-MAA) film however, it provides slower development of the top-most and bottom-most PMMA in photoresist layers 500. The photoresist layer 502 has been stripped away prior to the MIBK:IPA develop. The appearance of the gate contact mask after development of the exposed electron beam photoresist material and uncovering of the ohmic contact layer 312 in the gate contact mask window 518 is represented in the FIG. 5*d* drawing.

The resolution and precisely controlled nature of this FIG. 5*d* electron beam exposure sequence allows placement of the gate contact in the center of the gate window 334 as shown or alternately allows precise placement closer to either source or drain contact as is desired in some transistor devices. It may be appreciated that a plurality of factors have been combined in defining the desired gate contact shape in this the EBOL related sequence. These factors include a combination of sensitivity difference between the films of the photoresist layer 500, the dosing modulation achieved with a linear and connected series of small rectangles electron beam scanning pattern, the differing development responses of the PMMA and P(MMA-MAA) in the layer 500, differing developer sensitivities and energy profiles.

Figure 5E:
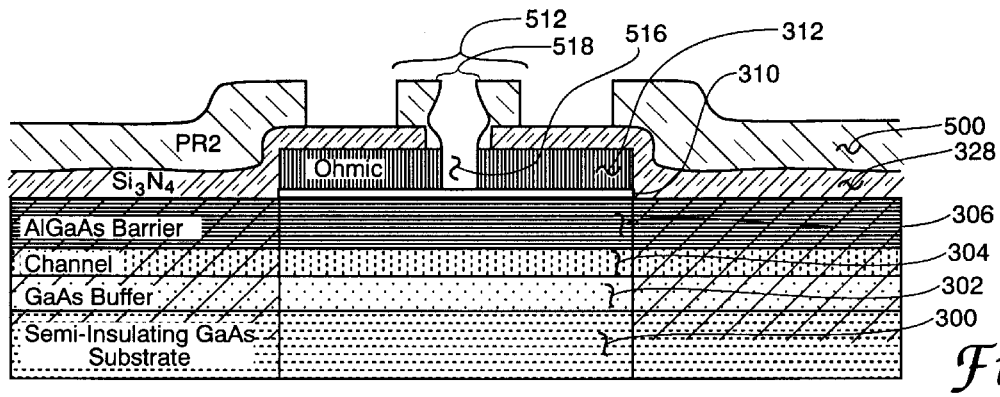
FIG. 5e shows the FIG. 5d structure after an additional processing step.

In the FIG. 5*e* drawing the results of using a selective etch step to remove a gate sized aperture 516 in the ohmic contact layer 312 are represented. Complete removal of the ohmic contact layer 312 down to the etch stop layer 301 is desired since the subsequently received gate metal is to be formed on the barrier layer underlying the ohmic contact layer 312. Selective etch of the indicated indium gallium arsenide material of this layer ohmic contact layer 312 may be accomplished using the citric acid/hydrogen peroxide etch process described above; a precise end point for this etch is established by the etch stop layer 310. It is notable that the source and drain regions of the FIG. 5 transistor, the regions at 508 and 510, remain protected by the secondary mask layer 328 during this FIG. 5*e* selective etch step.

Figure 5F:
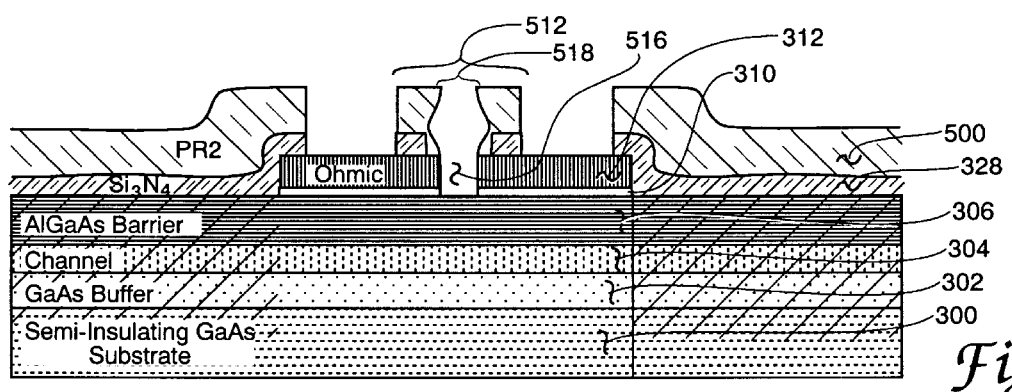
FIG. 5f shows the FIG. 5e structure after an additional processing step.

FIG. 5*f* represents accomplishment of a wet chemical etching of the secondary mask layer 328 in the source and drain regions 508 and 510 to remove the silicon nitride secondary mask layer 328 and expose the ohmic contact layer 312 material of the source and drain regions in the transistor. Notably this same wet chemical etch also serves to remove the etch stop layer 301 in the window 518 to form the gate contact recess aperture 516. A buffered oxide etchant solution is used for the FIG. 5*f* joint source/drain and gate etches. An etch solution composed of BOE and de-ionized water and available from Ashland Chemical Corporation may be combined with water in a concentration between one to fifty and one to two hundred and used for this purpose. Notably this FIG. 5*f* etch step represents a selective removal of the indium gallium arsenide or the graded layers comprising the ohmic contact layer 312 from the gate region through the expediency of having included the secondary mask layer 328 in the FIG. 5 device and without use of a two step lithographic process.

Figure 5G:
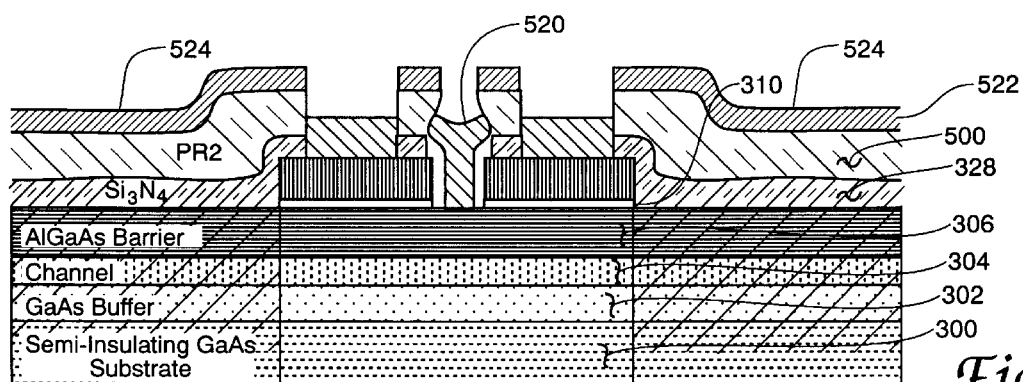
FIG. 5g shows the FIG. 5f structure after an additional processing step.

With the source/drain and gate regions of the FIG. 5*f* device exposed, a single deposition of metal as represented at 522 in FIG. 5*g* can be accomplished. A metal scheme of titanium platinum and gold in the respective thicknesses of 200:500:5300 is again found desirable for this purpose. Other metal combinations including titanium and gold in the thickness range of 6000 Angstroms and the combination of nickel and gold may also be used in this step. Any metal that forms both a Schottky contact to the gallium arsenide, or other selected group III–V gate region semiconductor material, and an ohmic contact to highly doped ohmic layer version of this semiconductor material and can be deposited by evaporation can be used in the metalization step—so long as the metal also does not degrade the underlying photoresist during deposition. This metalization step forms the gate contact 520 in FIG. 5*g* and also deposits metal at 524 over the top surface of the FIG. 5*f* structure as shown in FIG. 5*g*, i.e., over the photoresist layer 500.

This metalization step thereby may be used to form the interconnecting conductors of the transistor including the gate feed and pad regions. For such interconnecting conductor formation it is necessary to have previously removed the photoresist layer 500 at the desired interconnect regions since a metal lift-off-step is again used subsequently to remove any metal supported only by such photoresist mask material. Since the same photoresist pattern is used both as the gate recess etch mask and as the present gate metal definition mask, the gate metal of the FIG. 5*g* step will be self-aligned to the etched gate recess region on the FET channel.

Figure 5H:
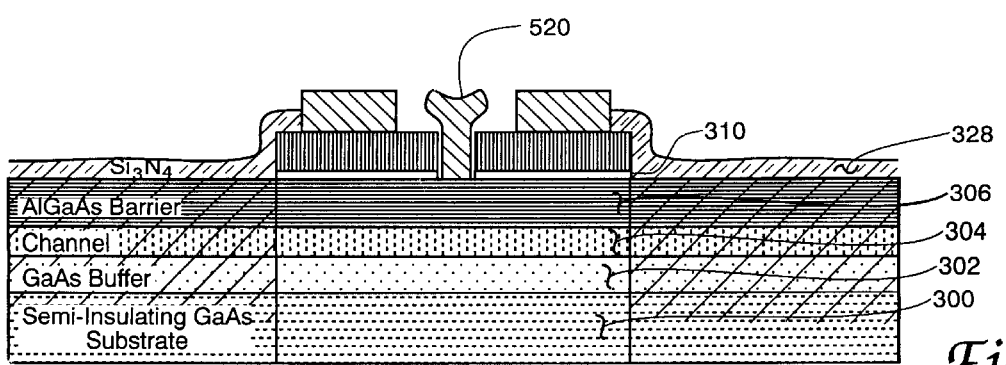
FIG. 5h shows the FIG. 5g structure after an additional processing step.

Removal of the photoresist layer 500 is represented in the FIG. 5*h* drawing. This removal accomplishes a metal lift-off separation of undesired metal from desired metal by way of the lip or overhang or cliff region 341 areas described previously. The device achieved after this metal lift-off includes non-alloyed contacts in the source/drain and gate regions Following such metal lift-off the FIG. 5 device is complete and ready for known device incorporation procedures.

While the above description of the EBOL process is believed sufficiently complete to enable its understanding and accomplishment by persons of skill in the semiconductor device art the following additional descriptive material which appears in the above referenced article of J. S. Sewell et al., may be of assistance in facilitating this understanding and accomplishment. This material is in the form of a two paragraph description of the EBOL process followed by recitation of the seven steps used in fabricating a 0.25 micrometer mushroom gate field-effect transistor device by this process.

"The EBOL process is as follows. The wafer is coated with standard e-beam resist scheme (1 to 3 layers), followed by a layer of optical photoresist. The wafer is then aligned and exposed to the gate pad mask using an optical mask aligner. The top photoresist is then developed. The resulting pattern is used as a mask for a deep UV exposure of the e-beam resists. The large patterns are now exposed. The top layer photoresist is then removed without damaging the underlying e-beam resists. Next, the gates are written by e-beam. Once the exposed resists are developed, metal is deposited. The resulting metal layer consists of very large gate pads and 0.25 $\mu$m gate fingers. The turn-around time is very fast compared to our standard 2-cycle process, and no step coverage problem exists of the gate fingers onto the gate pads.

The major obstacle in developing this process was to remove the top-layer photoresist after the deep UV exposure without affecting the underlying e-beam resists. It was first believed the optical photoresist could be developed out after the deep UV exposure if it was flood exposed by light. Poly-(methyl methacrylate) (PMMA)[2] was used for the initial process development. The optical photoresist used was 1400–27[3]. When 351 developer[4] was used to remove the exposed 1400–27, a thin film formed between the PMMA and the 1400–27 resists which could not be removed by realistic methods (i.e. solvent clean, microposit remover 1165[5], or oxygen plasma stripper). SAL 110-PLI[6] (PMGI) was tried in place of PMMA and a similar film formed. After unsuccessful attempts to try to develop the photoresist away, dissolving it was tried. PMGI can be dissolved by 1165, PMMA by 1165 or by acetone, and 1400–27 by acetone. Fortunately, the dissolution rate of PMMA in acetone is much slower than 1400–27 in acetone. A short blast of acetone was shown to remove the 1400–27 without significantly affecting PMMA or PMGI resists. After the photoresist was removed the e-beam write, development, gate recess etch, gate deposition and lift-off were routine." The text adjacent the superscripted numbers 4, 5, and 6 in these paragraphs refer to product name designations of the Shipley Company Incorporated of 455 Forest Street, Marlborough, Mass., 01752.

The seven step 0.25 micrometer gate example of an EBOL fabricated device is as follows. Drawings representing device appearances in connection with each step appear in the Sewell et al. paper.

1. Solvent clean. Spin e-beam resist—PMMA 496K 4% (60 seconds at 3000 rpm), P(MMA-MAA) Type 19% (60 seconds at 3000 rpm), PMMA 496K 4%; chlorobenzene (2:1) (60 seconds at 3000 rpm). Bake—5 minutes on a 200° C. hot plate. Spin optical photoresist—1400–27 (30 seconds at 4000 rpm). Bake—5 minutes on a 100° C. hot plate.
2. Align and expose optical resist using gate pad/interconnect mask—12 mw/cm$^2$ for 42 seconds. Develop 1400–27 photoresist—351: de-ionized water (1:5) (30 seconds at 500 rpm), de-ionized water (30 seconds at 500 rpm). Deep-UV exposure—240 nm at 10 mw/cm$^2$ for 600 seconds.
3. 1400–27 removal—acetone spray (15 seconds at 500 rpm), isopropyl alcohol (15 seconds at 500 rpm).
4. E-beam direct write—JEOL JBX5DII(U), 5th lens, 50 kV, 50 pA, (A,10), center single-pass-lines (dose: 3.5 $\mu$C/pm), 0.1 $\mu$m offset wing areas (0.25 $\mu$m wide) (dose: 150 $\mu$C/$\mu$m$^2$).
5. Develop e-beam resists—chlorobenzene 15 seconds at 500 rpm), isopropyl alcohol (30 seconds at 500 rpm), Methyl-isobutyl-ketone (MIBK): isopropyl alcohol (1:1) (90 seconds at 500 rpm), isopropyl alcohol (30 seconds at 500 rpm).
6. Oxygen plasma. Gates recess—standard. Pre-metal dip—standard. Gate metal deposition—approximately 7500 Å (standard gate metal).
7. Gate metal lift-off. Solvent clean.

The cooperation achieved between the primary and secondary mask sets in each of the above described fabrications of the present invention is believed worthy of added discussion and emphasis, especially since this cooperation is enabling of significant aspects of the invention. As has been already indicated the primary and secondary mask sets even though coexistent on the transistor under fabrication during certain portions of the fabricate process are made from different materials, materials which are of widely varying and therefore highly useful characteristics in the transistor fabrication process. The primary mask for example is made from photosensitive or photoresist material, material which is responsive to light exposure and responsive to the usual organic solvent liquids such as acetone and MIBK, Chlorobenzene. The secondary mask in contrast is made from silicon nitride or similar inorganic materials and is therefore not responsive to either light exposure or organic solvents and is removed with the aid of a reactant which is largely inert with respect to the semiconductor materials surrounding it. These contrasts in sensitivity and reaction response are of course usable to considerable convenience in the described fabrication sequences.

These diverse properties in two concurrently used masks in the present invention are therefore selected in order to enable the accomplishment of such features as a one mask determination of gate region geometry in a fabricated transistor, etching removal of selected areas of the primary mask by way of apertures existing in the secondary mask and excess deposited metal lift-off (including its supporting photoresist mask) while one mask, the secondary mask, remains in permanent (and useful) position. In a larger sense it is this use of two contrasted material independent masks which enables the present use of a single metalization for ohmic and Schottky contacts to the transistor under fabrication.

In referring here to diverse properties in two concurrently used masks it is of course intended that the primary and secondary masks 315 and 328 in FIG. 3 are under consideration as opposed to the two differing masks (each of photoresist material) employed in the above referred to EBOL lithography sequence. These EBOL masks are made of differing photoresist materials in order to be properly responsive to the differing exposures of an electron beam and a two wavelength optical exposure. The two materials employed in these masks are nevertheless each responsive to photo exposure sequences and removable with organic solvents in contrast to the differing properties of the intended secondary masks. In reality moreover the two EBOL masks may be considered to be component parts of what is termed the "primary mask".

Fabricated Devices

Figure 7:
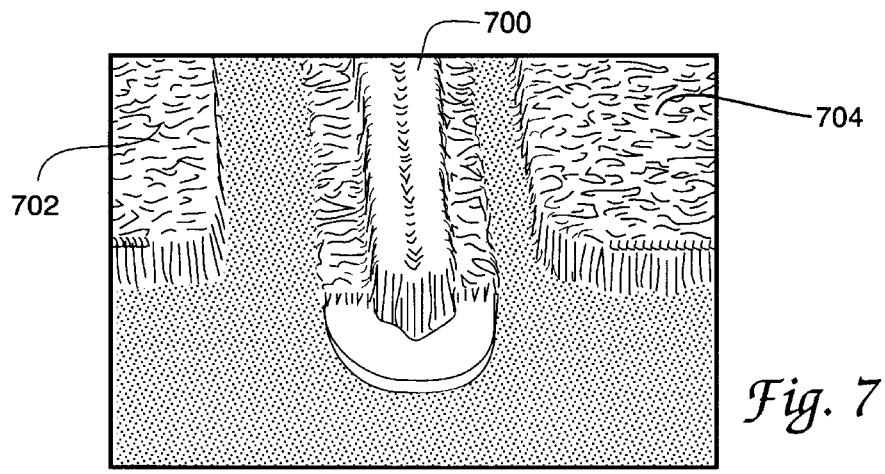
FIG. 7 shows a drawing representation of a partial cross sectional microphotograph of a transistor according to the invention.
Figure 8:
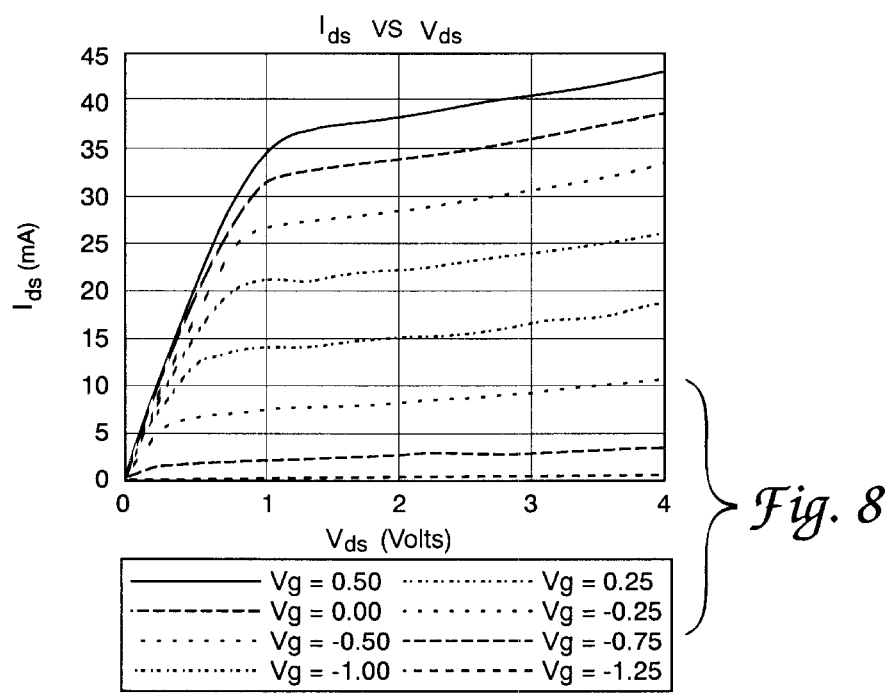
FIG. 8 shows the current versus voltage characteristics for a field-effect transistor according to the invention.
Figure 9:
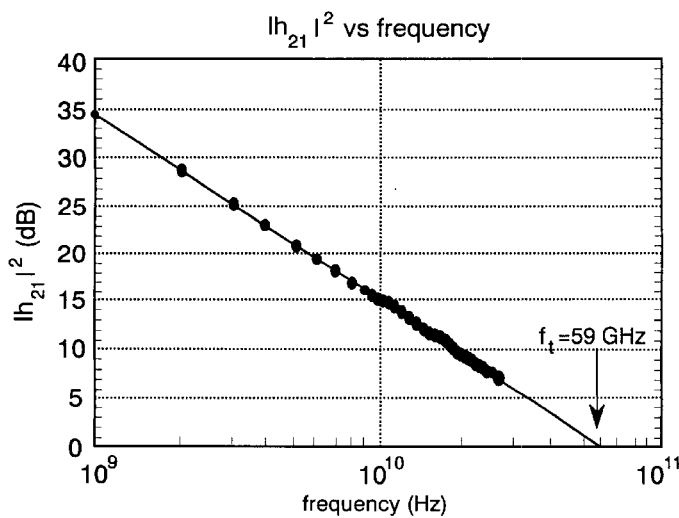
FIG. 9 shows a frequency response relationship for a field-effect transistor according to the invention.

A drawing representation of a microphotograph of a MESFET device of 0.2 micrometer gate length and fabrication according to the present invention appears in FIG. 6 of the drawings. A drawing representation of a cross sectional scanning electron microscope microphotograph of this same device appears in FIG. 7 of the drawings. In the FIG. 7 representation the endmost portion of a gate contact element appears at 700 and source and drain contacts at 702 and 704 for example. The following paragraphs of fabricated device description relating to these drawings are paraphrased from the above-identified published article of G. C. DeSalvo et al., and describe the electrical characteristics of MESFET devices resulting from a fabrication according to the above-described sequence.

Figure 4:
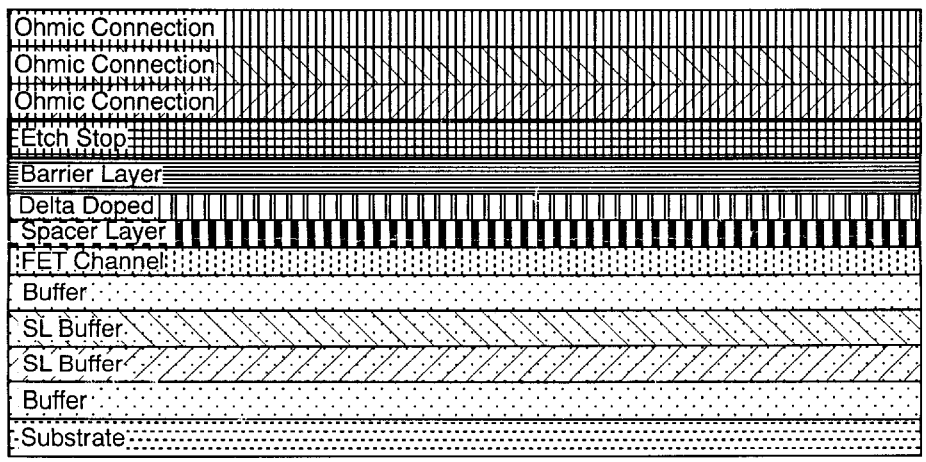
FIG. 4 shows a pHEMT type field-effect transistor which includes each of the layers identified in Table 1 herein.

GaAs pHEMT devices having the structure shown in FIG. 1 were fabricated using the described SLIMFET process. A drawing representation of a scanning electron microscope (SEM) micrograph of a completed pHEMT device is shown in FIG. 3\*. The single layer metalization of the drain, gate, and source contacts result in the absence of a metal step from the contact to interconnect layer in these drawings. In FIG. 4\*, a SEM micrograph of the gate cross section shows the "mushroom" shape of the gate and the ensuing 0.2 $\mu$m gate length achieved through e-beam lithography with the described resist combination appears.

After the metalization step, ohmic contact resistance was measured using standard transmission line model (TLM) patterns. These devices achieved an average contact resistance of 0. 164 ohm·mm, specific contact resistance of 4.13×10$^{-7}$ ohm·cm$^2$, and sheet resistance of 169.62 ohm/square for non-alloyed Ti/Au metal on the In$_x$As/In$_x$Ga$_{1-x}$As contact layers. These results compare well with earlier results from standard GaAs and other InGaAs ohmic contact layers.

Both DC and RF testing was completed for these devices. A family of I–V curves for a fabricated 50 $\mu$m wide, two finger, center tapped pHEMT with 0.2 μm gate length is shown in the drawing of FIG. 5*. The saturated drain-source current ($I_{dss}$) averaged 195.6 mA/mm, with a peak transconductance of 319.83 mS/mm at a gate voltage of −0.55 V. The pinch off voltage was measured to be −1.25 V. S-parameter testing was performed from 1 to 26 GHz. The extrapolated cutoff frequency ($f_t$) is a maximum of 59 GHz, and is shown in FIG. 6*. This result is comparable to standard pHEMTs fabricated using a conventional process. Drawing FIG. numbers bearing the asterisk (*) notation of course refer to published article FIG. numbers, which are omitted herein, rather than to present document FIG. numbers.

Table 2 below provides a comparison between the steps used in a conventional field-effect transistor fabrication process and the process of the present invention. Although a first blush review of this comparison table may suggest the present invention steps are almost as numerous as those of the previous process a detailed consideration of the data in this table reveals that several of the present invention steps can also be accomplished more quickly—by a considerable margin, than is possible in the more conventional process.

ohmic contact semiconductor layers of the transistor this tendency toward greater contact resistance is however, limited to a degree believed acceptable in many field-effect transistor uses.

The reward for acceptance of any compromise of this nature is of course realized in the simplification of device processing, probably increased wafer yields and the resulting decrease in device cost. The employment of a single metalization step is of course a notable area of present processing simplification. A significant enabling factor in achieving this single metalization involves use of the relatively inert secondary mask element and the separation of gate region fabrications steps from source and drain region fabrication steps it makes possible.

Another area of present processing simplification which may be viewed as the acceptance of device-impacting compromise resides in the area of combined electron beam and optical lithography steps in a single device. While conventional wisdom may suggest the maintenance of separation between processes involving these two exposure arrangements is desirable to avoid their compromising interaction,

TABLE 2

| SLIMFET Process | Standard FET Process |
|---|---|
| 4 Lithography Steps:<br>  Mask Alignment<br>  Device Isolation<br>  Gate Window<br>  Ohmic/Gate Feed/Pad/Gate Metal | 5 Lithography Steps:<br>  Mask Alignment<br>  Device Isolation<br>  Ohmic Metal<br>  Gate Feed & Contact Pad Metal<br>  Gate Metal |
| 2 Metal Depositions and Metal Lift-Off Steps<br>  Mask Alignment Marks (Ti/AU)<br>  Ohmic/Contact Pads/Gate (Ti/Au) | 4 Metal Depositions and Metal Lift-Off Steps<br>  Mask Alignment Marks (Ti/Au)<br>  Ohmic Contacts (AuGe/Ni)<br>  Gate Feed & Contact Pads (Ti/Au)<br>  Gate Contacts (Ti/Au) |
| 0 Metal Alloys | 1 Metal Alloy |
| 1 $Si_3N_4$ Deposition | 0 $Si_3N_4$ Depositions |
| 3 Selective Etch Steps<br>  Gate Window<br>  Gate Recess<br>  $Si_3N_4$ Removal for Ohmic Contacts | 1 Selective Etch Step<br>  Gate Recess |

In particular the elimination of steps involving metalization and its attending lithography from the SLIMFET process represent notable time and cost savings. The hours of time involved in accomplishing an accurate mask alignment, the time to evacuate a metalization chamber, the time to accomplish the metalization, and then the time to relieve the vacuum at a controlled rate typically combine to limit fabrication throughput when multiple metalizations are involved for a device. Many etching steps in comparison are of significantly lower cost than a metalization step and therefore are of less significance in device fabrication time and bottom line cost. In considering the Table 2 comparison of the present SLIMFET process with a conventional process therefore these second blush detailed factors also merit consideration.

By way of additional comparisons relating to the present invention, it is recognized that conventional transistors of the type described herein make use of the well known gold germanium nickel ohmic contacts and thereby achieve what is considered to be desirable low electrical resistance at these contacts. It is further recognized that the presently espoused use of Schottky metalization, i.e., the herein disclosed titanium platinum gold or platinum gold alloys for example for this ohmic contact function, may be considered an area of device performance compromise, compromise in that somewhat higher source and drain contact resistance can result. With the herein disclosed arrangement of the the present inventors believe the combination of these exposures as disclosed herein and in the literature is sufficiently well tuned so as to have little negative effect on the resulting devices.

Another present process enhancement concerns a selective gate recess etch, which allows for unusually desirable control of the gate etch. Typically, gate recess etching is performed in an iterative, "etch to a target current" process. The SLIMFET process however, discloses a gate etch that can be accomplished without probing the ohmic contacts and thereby allows the ohmic contacts to be covered with protective $Si_3N_4$ during the gate recess etch. Additionally, the SLIMFET process prevents problems with metal step coverage or metal to metal overlap, problems whose elimination relate closely to yield improvement.

Another feature of the disclosed fabrication is the use of a non-alloy ohmic metal process which further improves device uniformity and eliminates an undesirable high temperature processing sequence. The SLIMFET process also requires only one dielectric deposition step instead of two as in the best existing technique. Metal definition in the disclosed SLIMFET process is by lift-off and not by the more expensive ion milling. This metal lift-off requires no expensive equipment, and does not introduce damage or transistor performance degradation. Finally the employed process for this device is also compatible with monolithic microwave integrated circuit (MMIC) and other fabrication techniques and minimizes process variations, cycle time, and cost.

The present invention is therefore believed to represent the first ever AlGaAs/InGaAs HEMT/pHEMT fabricated using a single layer metalization scheme for both the Schottky gate and ohmic contacts. The fabricated device achieves a cut-off frequency of 59 GHz for sub 0.5 micron gate length, which represents state-of-the-art performance in single metal transistors. The SLIMFET process is again achieved through the integration of: the electron-beam/optical lithography process, selective gate recess etching, and non-alloyed ohmic contacts. The SLIMFET process greatly simplifies the fabrication of FET devices while minimizing process variations. The described process is also believed feasible for lower frequency amplifier transistors.

While the apparatus and method herein described constitute a preferred embodiment of the invention, it is to be understood that the invention is not limited to this precise form of apparatus or method and that changes may be made therein without departing from the scope of the invention which is defined in the appended claims.

What is claimed is:

1. The single metal method for completing the electrical contacts of a high electron mobility/pseudomorphic high electron mobility gallium arsenide field-effect transistor of less than six tenths micron feature size in a wafer having a substrate-supported initial plurality of gallium arsenide-inclusive semiconductor material layers, including an outermost channel layer, said method comprising the steps of:

growing a gallium arsenide-inclusive semiconductor barrier layer on said channel layer;

depositing a permanent thin etch stop layer of metallic arsenide material on said semiconductor barrier layer;

isolating a lateral area of said wafer including said initial, said grown and said deposited wafer layers into individual transistor active areas;

forming a gallium arsenide-inclusive ohmic connection layer over portions of said permanent thin etch stop layer in said individual transistor active areas of said wafer;

covering said wafer including said active area ohmic connection layer portions and exposed portions of said permanent thin etch stop layer with a permanent secondary mask and passivation material layer;

etching through said permanent secondary mask and passivation material layer to said ohmic connection layer at a first temporary photoresist mask layer-defined gate window location of each transistor of said wafer;

removing said first temporary photoresist mask layer and covering said permanent secondary mask and passivation material layer and said now exposed gate region ohmic connection layer of each transistor with a second and an outermost third temporary photoresist mask layers, said second and third temporary photoresist mask layers having ultraviolet/electron beam and optical masking properties respectively;

opening source and drain recess apertures through said second and third temporary photoresist mask layers of each said transistor using an exposure and etching sequence, said source and drain recess apertures extending to said permanent secondary mask and passivation material layer;

dissolving said outermost third photoresist layer from coverage of said second photoresist layer;

defining a gate aperture position and gate aperture size in said second photoresist layer in said gate window location using an electron beam lithography exposure and development sequence;

etching a gate contact recess aperture through said ohmic connection material layer at said gate aperture position in said gate window location using a selective etch sequence, said gate contact recess aperture extending to said permanent etch stop material-covered barrier layer;

said ohmic connection material supporting said source and drain locations being protected during said selective etching sequence by said permanent secondary mask and passivation material layer;

said selective etching sequence being halted in said gate contact recess aperture of said gate window location by said permanent thin etch stop layer of metallic arsenide material;

etching away said permanent secondary mask and passivation material layer to said ohmic connection material layer in said source and drain locations, said etching away step simultaneously etching away said permanent thin etch stop layer of metallic arsenide material to said gallium arsenide-inclusive semiconductor barrier layer in said gate contact recess aperture;

said second temporary photoresist mask layer covering said permanent secondary mask and passivation material layer surrounding said gate window location and said source and drain locations being inert to said etching away step;

depositing Schottky barrier contact metal covering said gallium arsenide-inclusive semiconductor barrier layer in said gate contact recess aperture, covering said ohmic connection material layer in said source and drain locations, and concurrently covering said second temporary photoresist mask layer around said gate window location and around said source and drain locations, said contact metal forming a nonlinear Schottky barrier electrical contact relationship with said buffer layer semiconductor material in said gate contact recess aperture and a non-alloyed linear ohmic contact electrical relationship with said ohmic connection semiconductor material layer in said source and drain locations; and removing said second temporary photoresist layer from said wafer, said removing simultaneously performing a metal lift-off clearing of contact metal around said gate window and said source and drain locations of said transistor.

2. The method of claim 1 wherein said step of dissolving said outermost third photoresist layer from coverage of said second photoresist layer is accomplished concurrently with said step of opening source and drain recess apertures through said second and third temporary photoresist mask layers.

3. The method of claim 2 wherein said concurrent steps of dissolving and opening include etching with a citric acid and peroxide etchant solution.

4. The method of claim 3 wherein said citric acid and peroxide etchant solution is comprised of a citric acid to peroxide volumetric ratio of between 1:1 and 7:1.

5. The method of claim 1 wherein said deposited permanent thin etch stop layer of metallic arsenide material is comprised of aluminum arsenide material.

6. The method of claim 1 wherein said step of isolating a lateral area of said wafer into individual transistor active areas includes an oxygen ion implantation.

7. The method of claim 1 wherein said step of etching through said permanent secondary mask and passivation material layer to said ohmic connection layer at a first temporary photoresist mask layer-defined gate window location of each transistor comprises an optical lithographic sequence.

8. The method of claim 1 wherein said step of opening source and drain recess apertures through said second and third temporary photoresist mask layers comprises an optical lithographic sequence.

9. The method of claim 1 wherein said permanent secondary mask and passivation material layer is comprised of one of the materials of silicon nitride, silicon dioxide and gallium arsenide.

10. The method of claim 1 wherein said step of covering said permanent secondary mask and passivation material layer with a second and an outermost third temporary photoresist mask layers having ultraviolet/electron beam and optical masking properties includes a first electron beam photoresist layer comprising sub-layers of PMMA and copolymer photoresist materials.

11. A single metal method for upper layer fabrication in high electron mobility and pseudomorphic high electron mobility periodic table group III–IV semiconductor material field-effect transistors from a wafer having a substrate-supported initial plurality of semiconductor material layers, including an uppermost charged carrier communicating channel layer, said method comprising the steps of:
    growing a periodic table group III–IV material-inclusive semiconductor barrier layer over said channel layer of said wafer;
    forming a group III–IV material-inclusive ohmic connection layer over said barrier layer of said wafer;
    isolating said wafer, including said initial plurality layers, said barrier layer and said formed ohmic connection layer, into individual transistor active areas;
    covering said wafer including said ohmic connection layer active area portion with a secondary mask and passivation material layer;
    etching through said secondary mask and passivation material layer to said ohmic connection layer at a first temporary photoresist mask layer-defined gate window region of each field-effect transistor of said wafer;
    removing said first temporary photoresist mask layer and covering said underlying permanent secondary mask and passivation material layer and said now exposed gate region ohmic connection layer of each said transistor with a second and an outermost third temporary photoresist mask layers, said second and third temporary photoresist mask layers having optical masking properties;
    forming source, drain and gate region openings through said second and third temporary photoresist mask layers, said openings extending down to said permanent secondary mask and passivation material layer at said source and drain locations and down to said ohmic connection layer at said gate window location, said forming step also providing a subsequent metal lift-off procedure-enabling overhang relationship of said third temporary photoresist mask layer with said second photoresist mask layer at said gate window and source and drain locations of said transistor;
    removing said ohmic connection material layer from said gate window location using a selective etching step in which ohmic connection material underlying said source and drain locations is protected by said permanent secondary mask and passivation material layer and in which said selective etching is effectively halted in said gate window location by exposure of said barrier layer semiconductor material;
    etching away said permanent secondary mask and passivation material layer down to said ohmic connection material layer in said source and drain locations, said etching away step simultaneously preparing a surface portion of said semiconductor barrier layer in said gate window location for metal deposition, said second and third temporary photoresist mask layers covering said permanent secondary mask and passivation material layer surrounding said gate window location and said source and drain locations being immune to said etching away step;
    depositing a single contact metal layer simultaneously over said semiconductor barrier layer in said gate window location, over said ohmic connection material layer in said source and drain locations, and over said outermost third temporary photoresist mask layer around said gate window location and around said source and drain locations, said single contact metal layer forming a Schottky barrier electrical relationship with said barrier layer semiconductor material in said gate window location and a non-alloyed ohmic electrical relationship with said ohmic connection semiconductor material layer in said source and drain locations;
    removing said second and third temporary photoresist layers from said wafer, said removing simultaneously performing a metal lift-off clearing of contact metal around said gate window and said source and drain locations of said transistor.

12. The single metal method for upper layer fabrication of claim 11 wherein said ohmic connection layer is comprised of indium gallium and arsenic materials.

13. The single metal method for upper layer fabrication of claim 11 wherein said ohmic connection layer is comprised of indium gallium and arsenic materials arrayed in a plurality of sub-layers.

14. The single metal method for upper layer fabrication of claim 11 wherein said steps of etching through and etching away said secondary mask and passivation material layer to said ohmic connection layer each include an optical exposure of a photoresist material.

15. The single metal method for upper layer fabrication of 11 wherein said barrier layer is grown on said channel layer.

16. The single metal method for upper layer fabrication of claim 11 further including the steps of:
    growing an etch stop layer on said semiconductor barrier layer before forming said group III–V material-inclusive ohmic connection layer;
    forming said group III–V material-inclusive ohmic connection layer on said etch stop layer; and
    halting said selective etching in said gate window location at said etch stop layer.

17. The single metal method for upper layer fabrication of claim 16 wherein said single contact metal layer is deposited on said barrier layer in said gate window location.

18. The single metal method for upper layer fabrication of claim 11 wherein said secondary mask and passivation material layer is comprised of one of the materials of silicon nitride and silicon dioxide.

19. The single metal method for upper layer fabrication of claim 11 wherein said single contact metal layer is comprised of one of the Schottky metal alloys of titanium platinum gold and platinum gold.

20. The method of forming single metal gate, source and drain electrical contacts in high electron mobility and pseudomorphic high electron mobility gallium arsenide field-effect transistors comprising the steps of:

providing one of a transistor-divided high electron mobility and a pseudomorphic high electron mobility field-effect transistor gallium arsenide semiconductor wafer in which a permanent thin metallic arsenide etch stop layer overlays a channel layer-covering barrier layer and in which an etch stop layer superimposed ohmic connection layer is overlaid by a secondary mask and passivation material layer;

disposing over said secondary mask and passivation material layer a plurality of temporary mask material layers;

forming source and drain region recesses extending through said temporary mask material layers to said secondary mask and passivation material layer and a gate window recess extending to said ohmic connection layer using a temporary mask material-responsive etching sequence;

removing said ohmic connection layer in said gate window recess location by selective etching while said ohmic connection layer in said source and drain locations is protected by said secondary mask and passivation material layer;

halting said selective etching in said gate window recess location at said permanent thin etch stop layer of metallic arsenide material;

etching away both said secondary mask and passivation material layer, to said ohmic connection material layer in said source and drain locations, and said permanent thin etch stop layer to said barrier layer, in said gate window location, said temporary mask layers covering said secondary mask and passivation material layer surrounding said source, drain and gate window locations being immune to said etching away step;

forming a Schottky barrier electrical contact with said semiconductor barrier layer materials in said gate window location and a non-alloyed ohmic electrical contact with said ohmic connection semiconductor material layer in said source and drain locations by depositing a layer of unitary contact metal over said etching away step-exposed surfaces of said wafer.

21. The common metal method of fabricating metallizations in a gallium arsenide field-effect transistor comprising the steps of:

covering a plural layered gallium arsenide semiconductor wafer with a secondary mask and passivation material layer;

forming over said secondary mask and passivation material layer-covered wafer a plural layered photoresist mask, a mask defining source, drain and gate regions of each said field-effect transistor;

dissolving said secondary mask and passivation material layer and selected of said plural semiconductor layers in said mask-defined transistor gate region of said field-effect transistor;

removing said secondary mask and passivation material layer within said mask defined transistor source and drain regions of said field-effect transistor;

covering said wafer including semiconductor layers exposed by said removing and dissolving steps with a layer of selected common metal material;

lifting off portions of said layer of selected common metal to form a metal pattern of selected configuration, a configuration inclusive of electrically isolated source, drain and gate elements of said transistor.

22. The common metal method of fabricating gallium arsenide field-effect transistor metallizations of claim 21 wherein said step of removing a first selected semiconductor layer includes preparing an opening in a secondary mask and passivation material layer consisting of one of silicon dioxide and silicon nitride materials.

23. The single metal method for upper layer fabrication of claim 14 wherein said step of etching away said secondary mask and passivation material layer to said ohmic connection layer in said gate window location also includes an electron beam exposure of a photoresist material.

* * * * *